(12) United States Patent
Yao et al.

(10) Patent No.: US 8,124,504 B2
(45) Date of Patent: Feb. 28, 2012

(54) METHOD FOR GROWTH OF GAN SINGLE CRYSTAL, METHOD FOR PREPARATION OF GAN SUBSTRATE, PROCESS FOR PRODUCING GAN-BASED ELEMENT, AND GAN-BASED ELEMENT

(75) Inventors: Takafumi Yao, Miyagi-ken (JP); Meoung-Whan Cho, Miyagi-ken (JP)

(73) Assignees: Tohoku Techno Arch Co., Ltd., Sendai-shi, Miyagi-ken (JP); Furukawa Co., Ltd., Tokyo (JP); Mitsubishi Chemical Corporation, Tokyo (JP); Wavesquare Inc., Yongin, Gyeonggi-do (KR); Dowa Holdings Co., Ltd., Tokyo (JP); Epivalley Co. Ltd., Gumi, Gyungsangbuk-do (KR)

( * ) Notice: Subject to any disclaimer, the term of this patent is extended or adjusted under 35 U.S.C. 154(b) by 12 days.

(21) Appl. No.: 12/691,411

(22) Filed: Jan. 21, 2010

(65) Prior Publication Data
US 2010/0120234 A1    May 13, 2010

Related U.S. Application Data

(62) Division of application No. 11/910,609, filed on Jun. 16, 2008, now abandoned.

(30) Foreign Application Priority Data

Apr. 4, 2005  (JP) .................. 2005-108072

(51) Int. Cl.
*H01L 21/20* (2006.01)
(52) U.S. Cl. .................. 438/478; 257/E21.09
(58) Field of Classification Search .................. 438/478; 257/E21.09
See application file for complete search history.

(56) References Cited

U.S. PATENT DOCUMENTS 6,358,770 B2    3/2002   Itoh et al.
(Continued)

FOREIGN PATENT DOCUMENTS

CN          1617298 A      5/2005
(Continued)

OTHER PUBLICATIONS

Ri Kyokugen et al., "Low Temperature CrN buffer layer for GaN growth using MBE", Mar. 28, 2004, The Japan Society of Applied Physics and Related Socities, (The 51st Spring Meeting, 2004), No. 1, p. 364, 28p-YK-5.*

(Continued)

*Primary Examiner* — Kiesha Bryant
*Assistant Examiner* — Marvin Payen
(74) *Attorney, Agent, or Firm* — Cowan, Liebowitz & Latman, P.C.

(57) ABSTRACT

A GaN-based thin film (thick film) is grown using a metal buffer layer grown on a substrate. (a) A metal buffer layer (210) made of, for example, Cr or Cu is vapor-deposited on a sapphire substrate (120). (b) A substrate obtained by vapor-depositing the metal buffer layer (210) on the sapphire substrate (120) is nitrided in an ammonia gas ambient, thereby forming a metal nitride layer (212). (c) A GaN buffer layer (222) is grown on the nitrided metal buffer layers (210, 212). (d) Finally, a GaN single-crystal layer (220) is grown. This GaN single-crystal layer (220) can be grown to have various thicknesses depending on the objects. A freestanding substrate can be fabricated by selective chemical etching of the substrate fabricated by the above steps. It is also possible to use the substrate fabricated by the above steps as a GaN template substrate for fabricating a GaN-based light emitting diode or laser diode.

12 Claims, 28 Drawing Sheets

U.S. PATENT DOCUMENTS

| | | | |
|---|---|---|---|
| 6,455,340 | B1 | 9/2002 | Chua et al. |
| 6,824,610 | B2 | 11/2004 | Shibata et al. |
| 2001/0005023 | A1* | 6/2001 | Itoh et al. ............... 257/103 |
| 2002/0020341 | A1 | 2/2002 | Marchand et al. |
| 2002/0175340 | A1* | 11/2002 | Shibata et al. ............ 257/103 |
| 2002/0197825 | A1* | 12/2002 | Usui et al. ............... 438/459 |

FOREIGN PATENT DOCUMENTS

| | | |
|---|---|---|
| EP | 1245702 A | 10/2002 |
| JP | 2000-049092 | 2/2000 |
| JP | 2002-284600 | 10/2002 |
| JP | 2003-095799 | 4/2003 |
| JP | 2004-039810 | 2/2004 |
| JP | 2004-059325 | 2/2004 |
| JP | 2004-247753 | 9/2004 |
| JP | 2004-269313 | 9/2004 |
| JP | 2004-363213 A1 | 12/2004 |
| KR | 2002-76167 A | 10/2002 |
| KR | 20040067283 A | 7/2004 |

OTHER PUBLICATIONS

Ri Kyokugen, et al., "MBE-ho ni yoru Teion CrxN Buffer-so o Mochiita GaN no Seicho", Dai 51 Kai Oyo Butsurigaku Kankei Rengo Koenkai Koen Yokoshu, Mar. 28, 2004, No. 1, p. 364, middle part, 28p-YK-5.

T. Yodo, et al., Influence of substrate nitridation before growth on initial growth process of GaN heteroepitaxial layers grown on Si (001) and Si (111) substrates by ECR-MBE, Journal of Crystal Growth, 2001, vols. 227 to 228, pp. 431 to436, 2. Experimental procedure.

Pendeo-epitaxy versus Lateral Epitaxial Overgrowth of GaN: A comparative study via finite element Analysis, Zheleva, W.M. Ashmawi, K.A. Jones, phys. Stat. sol. (a) 176, 545 (1999).

Low-Temperature CrN Buffer Layers for GaN Growth Using Molecular Beam Epitaxy (31st International Symposium on Compound Semiconductors: announced in Sep. 12 to 16, 2004).

Growth and Characterization of HVPE GaN on c-sapphire with CrN Buffer Layer (31st International Symposium on Compound Semiconductors: Sep. 2004).

CrN Buffer Layer Study for GaN Growth Using Molecular Beam Epitaxy (22nd North America Conference on Molecular Beam epitaxy: Oct. 2004).

The above references (U.S Patents #1 and #2; U.S. Patent Publication #1; and Foreign Patent Document #1) were cited in a Jun. 1, 2009 Korean Office Action that issued in Korean Patent Application No. 2007-7025453, which is enclosed without English Translation.

The above reference (Foreign Patent Document #2) was cited in a Aug. 24, 2009 Supplementary European Search Report (copy enclosed) of the counterpart European Patent Application No. 06730906.2.

The above references were cited in a May 13, 2010 Korean Notice of Allowance, which is enclosed without an English Translation, that issued in Korean Application No. 10 2007-7025453.

The above reference was cited in a Jun. 12, 2010 Chinese Office Action, which is enclosed with Partial English Translation, that issued in Chinese Patent Application No. 2006800107591.

The above reference was cited in a Search Report issued on Apr. 28, 2010, concerning the corresponding European Patent Application No. 10156010.0, which is enclosed.

* cited by examiner (a)

| MATERIAL NAME <PLANE> | CRYSTAL STRUCTURE | INTERATOMIC DISTANCE IN PLANE DIRECTION [A] | LATTICE MISMATCHING[%] | | THERMAL EXPANSION COEFFICIENT IN PLANE DIRECTION [×$10^{-6}$/K] |
| --- | --- | --- | --- | --- | --- |
| | | | FOR $Al_2O_3$ (0001) | FOR GaN (0001) | |
| $Al_2O_3$(0001) | WURTZITE | 4.758 2.747 (30° rot) | – | -16.1 | 7.50 |
| 6H-SiC(0001) | WURTZITE | 3.081 | +12.2 | -3.51 | 4.46 |
| ZnO(0001) | WURTZITE | 3.250 | +18.3 | +1.88 | 2.9 |
| AlN(0001) | WURTZITE | 3.111 | +13.3 | -2.51 | 2.2 |
| TiN(111) | CUBIC CRYSTAL ROCK SALT STRUCTURE | 3.020 | +9.94 | -5.60 | 9.4 |
| CrN(111) | CUBIC CRYSTAL ROCK SALT STRUCTURE | 2.927 | +6.55 | -8.95 | 6.00 |
| GaN(0001) | WURTZITE | 3.189 | +16.1 | – | 5.45 |

FIG. 5-2

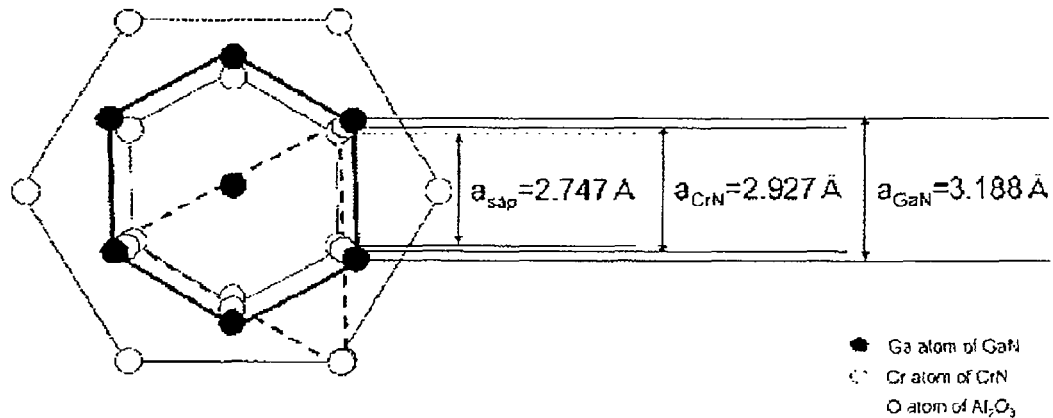

$a_{sap}$=2.747 Å  $a_{CrN}$=2.927 Å  $a_{GaN}$=3.188 Å

● Ga atom of GaN
○ Cr atom of CrN
○ O atom of $Al_2O_3$ (a)

(b)

FIG. 7-1
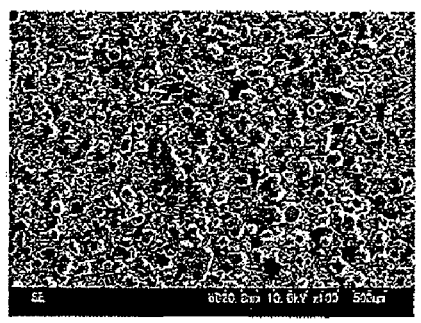
(a) 480 °C
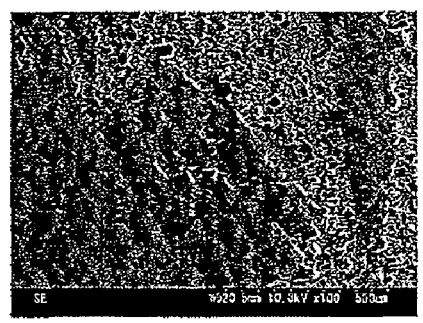
(b) 520 °C
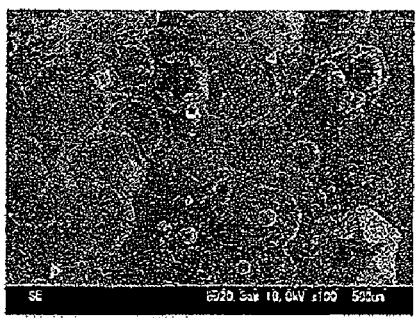
(c) 800 °C
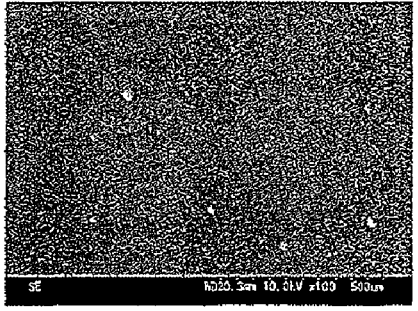
(d) 980 °C
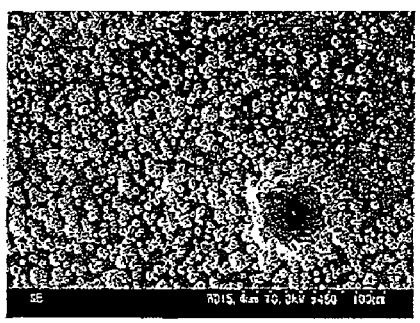
(e) 1040 °C F I G. 7-2
| NITRIDING TEMPERATURE | SURFACE MORPHOLOGY OF GaN LAYER | HALF-WIDTH OF (0002) XRD |
|---|---|---|
| 480 °C | X | X |
| 520 °C | X | X |
| 800 °C | ○ | △ |
| 980 °C | ◎ | ◎ |
| 1040 °C | ○ | ○ |
F I G. 8
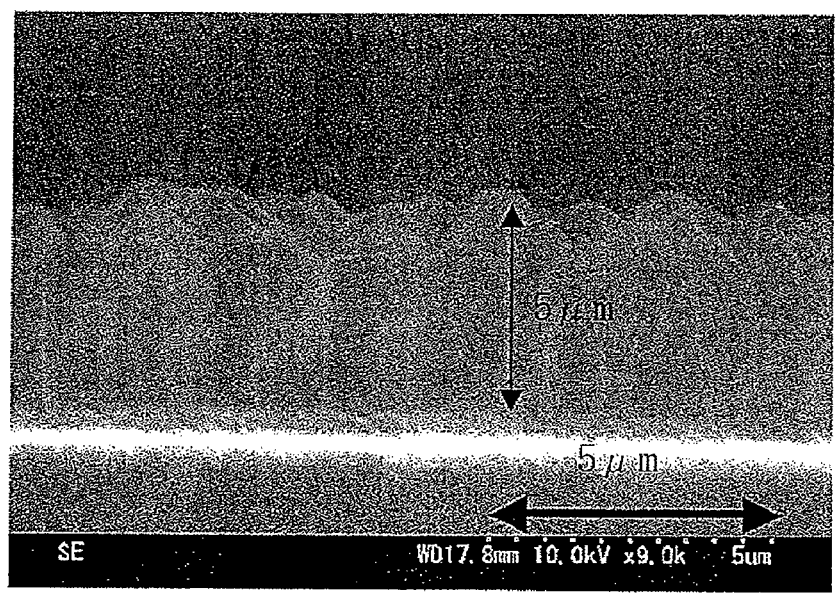

FIG. 8-1
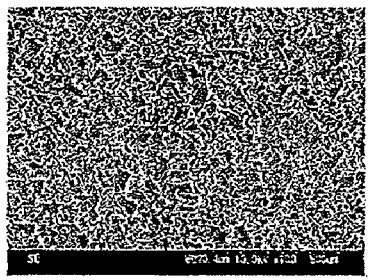
(a) 650 °C
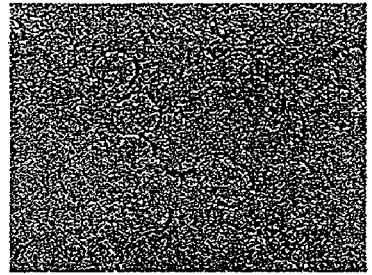
(b) 700 °C
(c) 800 °C
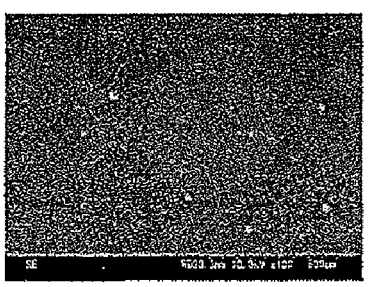
(d) 900 °C
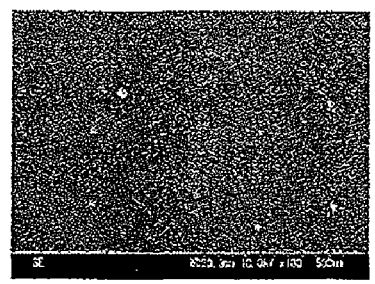
(e) 1000 °C
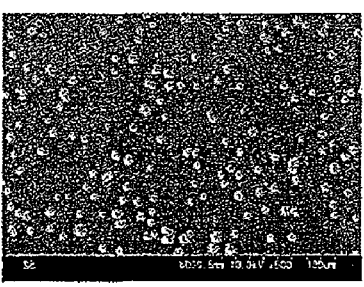
(f) 1100 °C
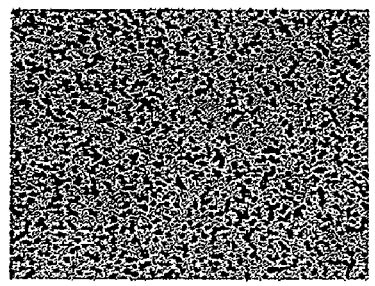
(g) 1150 °C
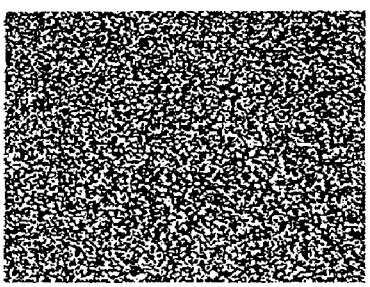
(h) 1200 °C F I G. 8-2
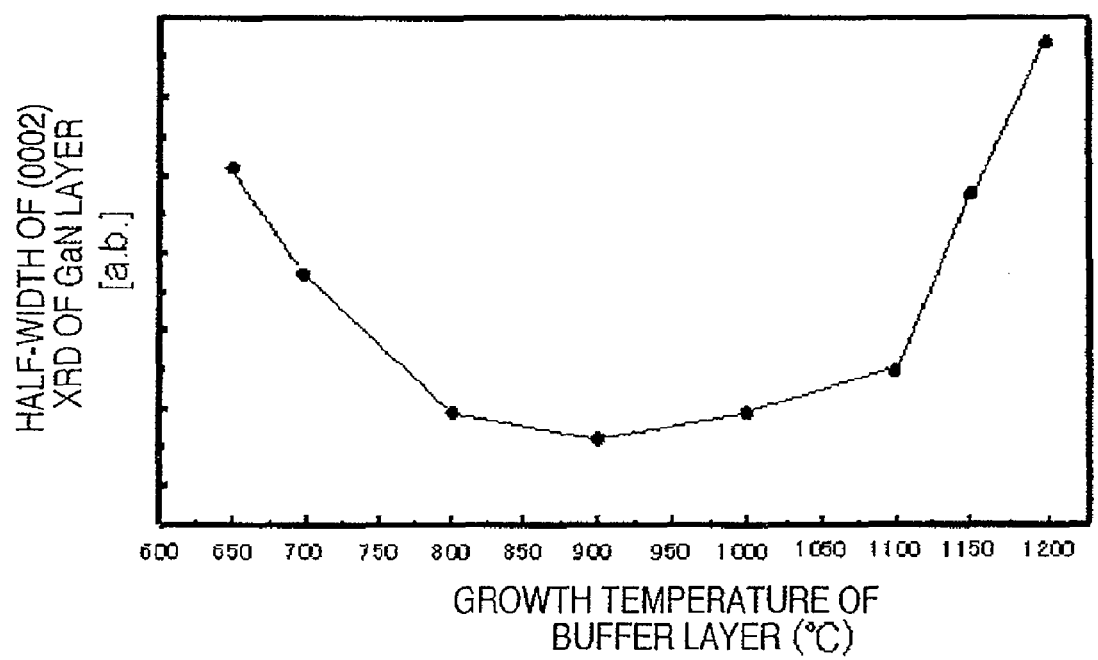

F I G. 8-3

| GROWTH TEMPERATURE OF GaN BUFFER LAYER | SURFACE MORPHOLOGY | HALF-WIDTH OF (0002) XRD |
|---|---|---|
| 650 °C | X | X |
| 700 °C | X | X |
| 800 °C | ○ | ○ |
| 900 °C | ◎ | ◎ |
| 1000 °C | ○ | ○ |
| 1100 °C | ○ | ○ |
| 1150 °C | X | X |
| 1200 °C | X | X |

FIG. 8-4
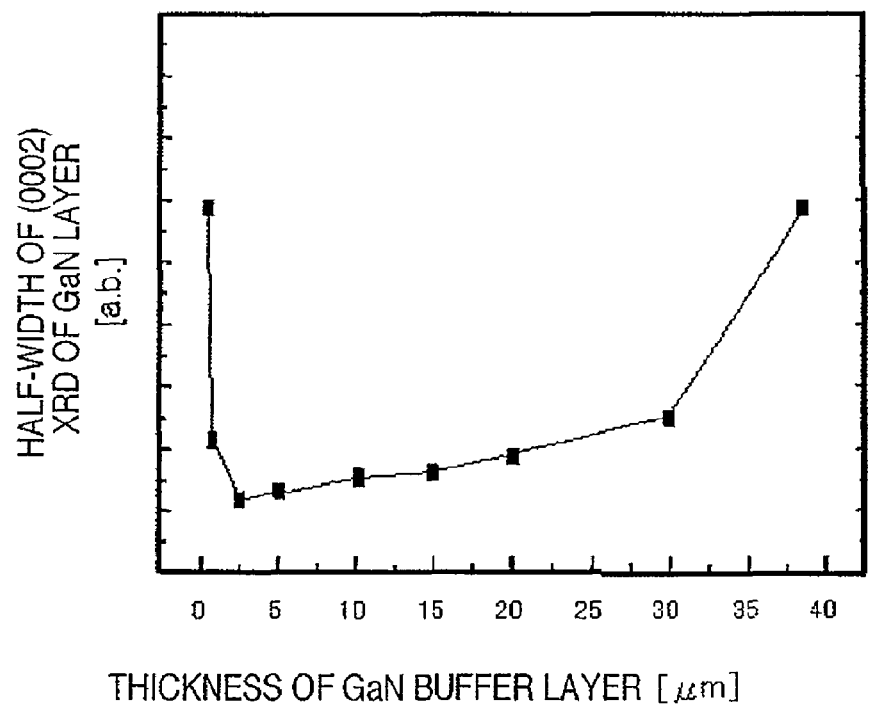
FIG. 9
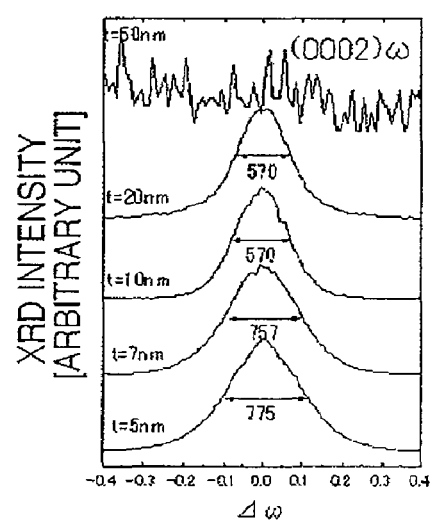
(a)
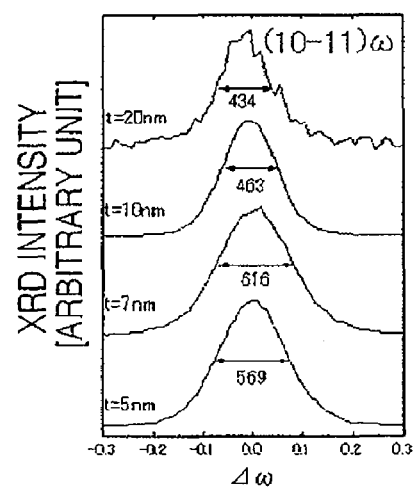
(b)

(a)

(b)

(c)

F I G. 13a
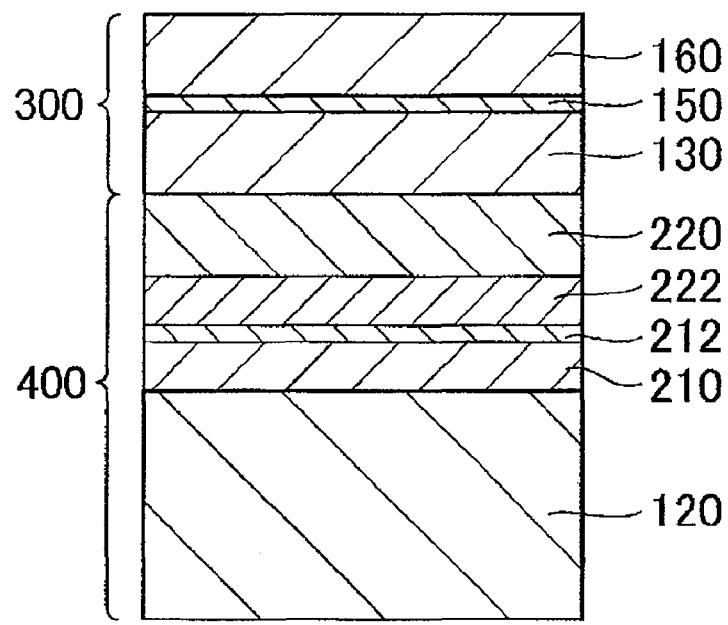
F I G. 13b
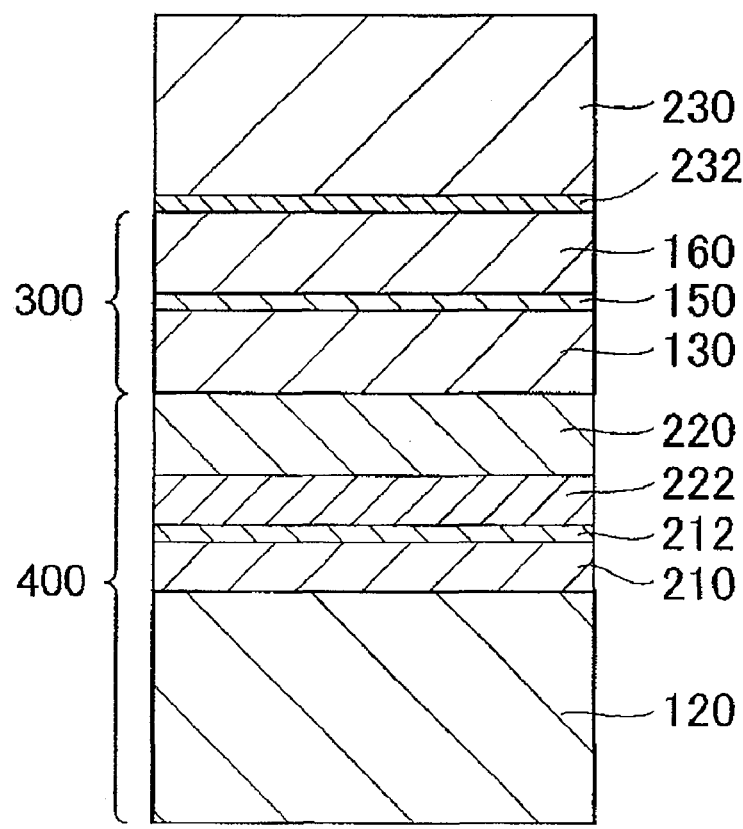

(1)

(2)

(a)

(b)

(c)

(a)

(b)

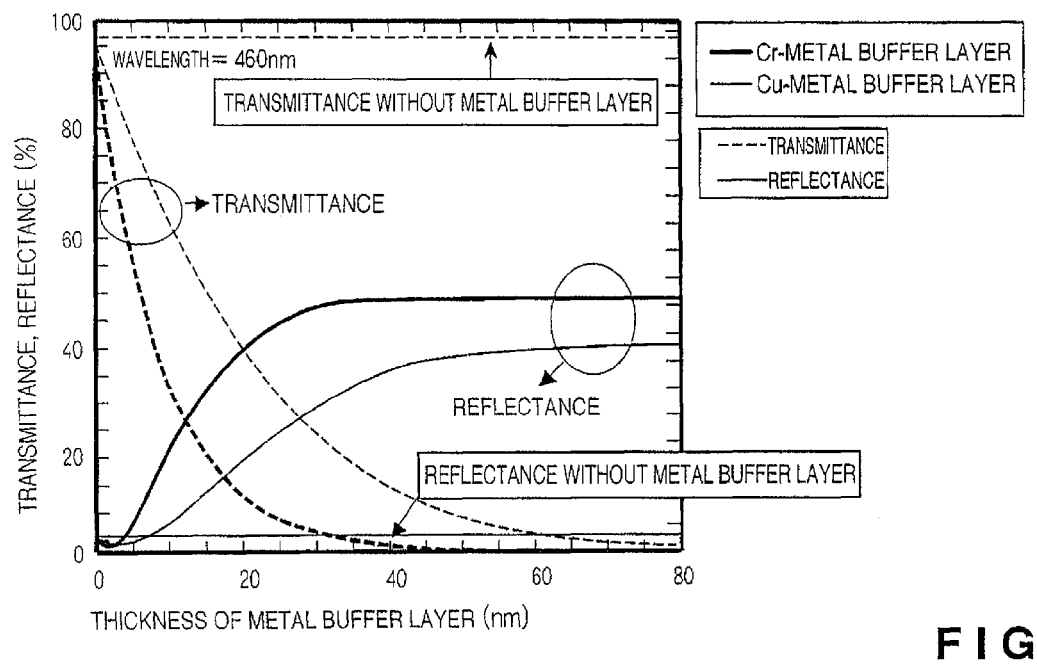
F I G. 16

F I G. 18
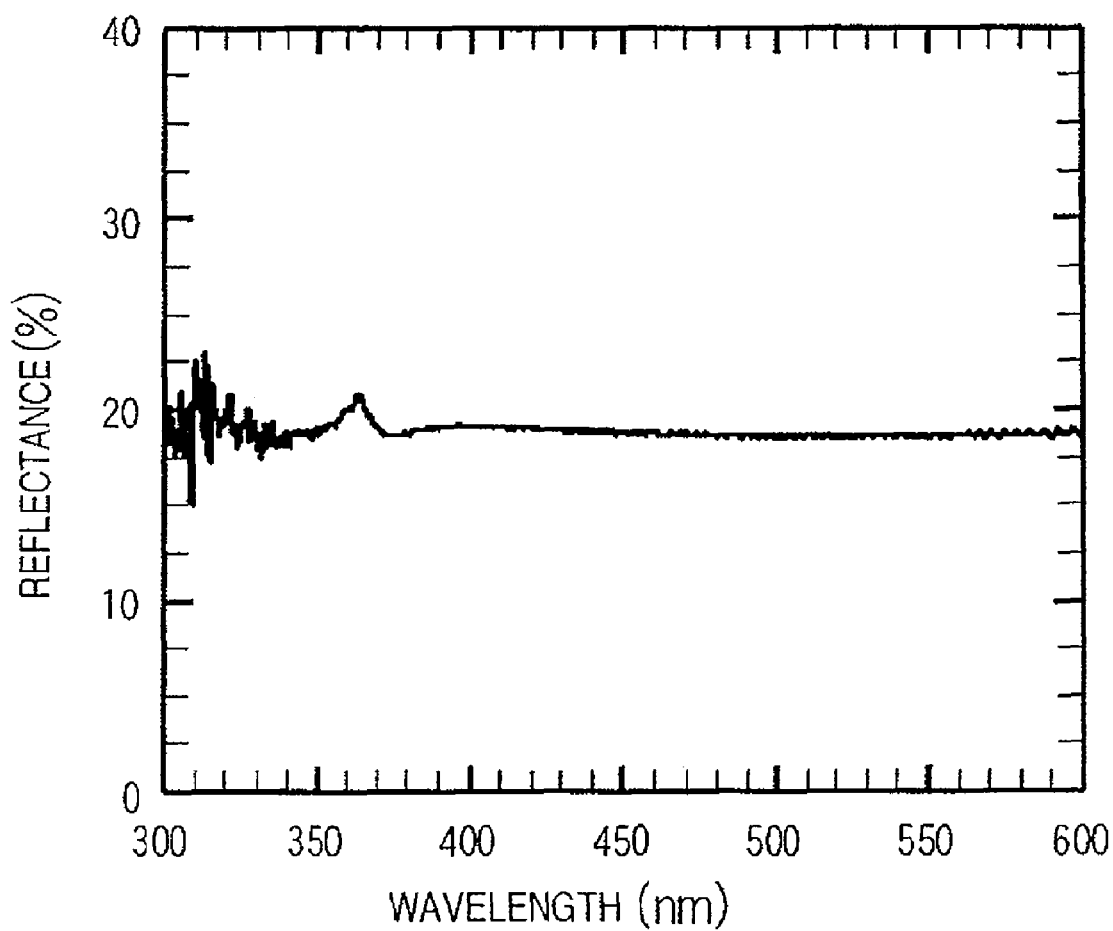

(a)

(b)

(a)

(b)

METHOD FOR GROWTH OF GAN SINGLE CRYSTAL, METHOD FOR PREPARATION OF GAN SUBSTRATE, PROCESS FOR PRODUCING GAN-BASED ELEMENT, AND GAN-BASED ELEMENT

CROSS-REFERENCE TO RELATED APPLICATIONS

This application is a divisional of application Ser. No. 11/910,609, filed Jun. 16, 2008 now abandoned the entire disclosure of which is hereby incorporated by reference.

TECHNICAL FIELD

The present invention relates to the fabrication of a GaN freestanding substrate or GaN template substrate and a method of fabricating a GaN-based element using the GaN template substrate and including a light-emitting element such as a light-emitting diode or laser diode or an electronic element and, more particularly, to the fabrication of a high-efficiency light emitting element or the like performed by a GaN single crystal growth method using a metal buffer layer.

BACKGROUND ART

Nichia Corporation, Japan and Lumi LED, U.S.A. are going ahead in the fields of the development and production of blue and white light emitting diodes and laser diodes using GaN-based compound semiconductors. Recently, various high-luminance light emitting element structures to be applied to the fields of illumination such as household fluorescent lamps and LCD (Liquid Crystal Display) backlights have been proposed and produced. GaN-based materials have well exhibited their possibilities not only as optical elements but also as high-power, high-temperature electronic elements. Presently, high-quality GaN crystals can be grown on a sapphire substrate by using the MOCVD growth method.

An example of the principal core techniques is the development of a low-temperature buffer layer. It is possible by using the MOCVD growth method to grow an amorphous or polycrystalline AlN or GaN buffer layer on a sapphire substrate at a low growth temperature of 400° C. to 700° C., and grow high-quality GaN crystals at a high temperature of 1,000° C. or more. That is, the technical development of the low-temperature buffer layer is presently the principal technique reaching the production of light emitting elements.

At present, however, the important subjects of the GaN-based light emitting elements are a high efficiency, a high output, and a short wavelength in the ultraviolet region. GaN-based thin films and thick films can be grown by methods such as MOCVD (Metal Organic Chemical Vapor Deposition), MBE (Molecular Beam Epitaxy), and HVPE (Hydride Vapor Epitaxy), in accordance with the purposes of the growth, and optical elements or electronic elements are implemented by using these methods. In particular, the HVPE growth method is mainly used in the fabrication of a GaN GaN freestanding substrate obtained by growing a thick GaN film on a sapphire substrate at a high growth rate of 100 μm/hr or more, and separating the substrate and thick GaN film by the laser lift-off method. In the fabrication of GaN-based optical or electronic elements, sapphire or SiC is presently mainly used as a substrate for crystal growth. However, a large lattice mismatching and a large thermal expansion coefficient difference cause a high defect density, that is, a dislocation density of about $10^{10}/cm^2$, thereby posing many problems such as element characteristic deterioration and the difficulty in element processing caused by the chemical resistance characteristic. Low-defect thin films can be grown by using various buffer layers to decrease the dislocation density, and by using the selective growth or lateral growth technique such as LEO (Lateral Epitaxial Overgrowth) or the PENDEO epitaxy method (non-patent reference 1). However, these growth techniques increase the unit cost of production because a number of steps are necessary to fabricate a substrate before the growth, and also have problems in reproducibility and yield.

A practical conventional technique of fabricating a high-luminance, high-output, blue light emitting diode will be described below. When fabricating a GaN-based light emitting diode on an insulator sapphire substrate, the TOP emission LED method as shown in FIG. 1 that emits light in the direction of the upper portion of a thin film is conventionally mainly used. Recently, however, as shown in FIG. 2(a), the light emission output can be increased to be about twice that of the conventional TOP emission LED method by using the LED-chip method (or the flip-chip method) that emits light in the direction of a sapphire substrate. Also, a high heat dissipating effect can be obtained because it is possible to perform a packing step in which a submount 110 having high conductivity and a thin film that generates heat are packaged close to each other. The output increases because the LED upper metal electrode does not physically limit the light. Also, as shown in FIG. 2(b), a mirror-coating 180 of the submount 110 can further increase the light emission efficiency.

Recently, as shown in FIG. 3, a new LED structure (FIG. 3(d)) having a top-down electrode is proposed which is fabricated by connecting an LED structure formed by growing a thin film on a sapphire substrate 120 by MOCVD (FIG. 3(a)) to a Si substrate 190 by using a metal junction layer 182 (FIG. 3(b)), and separating the sapphire substrate 120 and thin film by using the laser lift-off technique (FIG. 3(c)).

As another method of a high-output, high-efficiency light emitting diode, a patterned sapphire substrate 122 is sometimes used as shown in FIG. 4. This is a method in which fine patterns formed on the sapphire substrate 122 cause irregular reflection of light generated from an active layer of a light emitting element, and increase the amount of light emitted from the surface by suppressing the transmittance of light through the sapphire substrate, thereby increasing the light emission efficiency of the element.

As described above, the flip-chip technique, the use of the patterned sapphire substrate, the technique that increases the efficiency by using a reflecting electrode metal, and the like have been proposed to fabricate high-luminance, blue and ultraviolet light emitting diodes and laser diodes, but various problems such as the complexity of fabrication steps and the inefficiency of production have arisen. When growing a thin GaN film by using the conventional techniques, it is essential to form a seed layer of a low-temperature GaN or AlN buffer layer in order to grow a high-quality thin film because the growth is hetero growth on a substrate made of different material, such as a sapphire. However, even when this buffer layer exists, a large lattice mismatching and a large thermal expansion coefficient difference cause a high defect density, that is, a dislocation density of about $10^{10}/cm^2$.

Also, an electrode is difficult to form on the sapphire substrate because the sapphire substrate has an insulation property. Therefore, complicated steps including a step of dry-etching a grown thin film by about a few μm is necessary to form an electrode for a device.

Note that the fabrication of a device on a GaN substrate, instead of a sapphire substrate, has been regarded as most promising in order to greatly increase the LED light emission efficiency, achieve a high-current operation and high luminance, and fabricate a high-output ultraviolet laser. However, GaN bulk growth is technically difficult in the conventional GaN substrate fabrication. Instead, therefore, a thick GaN film is grown on a sapphire substrate by using the HVPE method, and separated from the substrate by mechanical polishing or the laser lift-off method, thereby fabricating a GaN freestanding substrate. Since, however, these methods require a high process cost after the growth of the thick GaN film, the development of a low-cost process has been desired.

The present inventors have grown a GaN layer on a CrN layer directly formed on a substrate by the MBE method (non-patent references 2, 3, and 4). To increase the area and throughput, however, it is possible to stack Cr by a method such as sputtering suited to mass-production, instead of stacking a CrN layer by the MBE method or the like, and form a Cr nitride layer by nitriding Cr in an HVPE apparatus capable of high-speed film formation and mass-production, thereby forming a template for GaN growth. Unfortunately, even when Cr is stacked on a sapphire substrate, this Cr forms a polycrystalline or multi-domain layer. A single crystal is difficult to grow on a polycrystalline or multi-domain layer. In addition, Cr forms an extremely stable Cr oxide (passivity) as is well known (a Cr oxide layer naturally forms on the surface of stainless steel, and protects the interior of stainless steel against corrosion). Since the substrate is moved from the sputtering apparatus to the HVPE apparatus by batch processing, the substrate must be transferred in the air, and Cr surface oxidation occurs during the process. The existence of this oxide layer interferes with the growth of a GaN single crystal. To epitaxially grow single-crystal GaN on a Cr nitride as described in non-patent references 2, 3, and 4, it is necessary to further form the nitrided Cr nitride layer into a single crystal. It is of course also possible to stack another metal by sputtering, nitride the metal, and epitaxially grow single-crystal GaN on the nitrided metal, but the above-mentioned difficulties (a metal film stacks as a polycrystalline layer, causes surface oxidation, and makes the formation of a single crystal difficult) still exist. Accordingly, a demand has arisen for the development of the process of GaN growth on a metal stacked film.

Note that patent references 1 and 2 also describe the growth of a GaN layer on a metal film. However, as the references disclose, although a GaN layer is formed after the formation of AlN, Al is unfavorable to the subsequent GaN growth process because the melting point of Al is low as a metal buffer layer (see patent reference 1). Also, although titanium is used as a metal film to form air spaces in a GaN layer by a Ti film and TiN film and then to detach the GaN layer, the air spaces may deteriorate the crystallinity of the GaN layer (see patent reference 2).

Non-patent reference 1: Pendeo-epitaxy versus Lateral Epitaxial Overgrowth of GaN: A comparative study via finite element Analysis, Zheleva, W. M. Ashmawi, K. A. Jones, phys. Stat. sol. (a) 176, 545 (1999)

Non-patent reference 2: Low-Temperature CrN Buffer Layers for GaN Growth Using Molecular Beam Epitaxy ($31^{st}$ International Symposium on Compound Semiconductors: announced in Sep. 12 to 16, 2004)

Non-patent reference 3: Growth and Characterization of HVPE GaN on c-sapphire with CrN Buffer Layer ($31^{st}$ International Symposium on Compound Semiconductors: September, 2004).

Non-patent reference 4: CrN Buffer Layer Study For GaN Growth Using Molecular Beam Epitaxy ($22^{nd}$ North American Conference on Molecular Beam epitaxy: October, 2004).

Patent reference 1: Japanese Patent Laid-Open No. 2002-284600

Patent reference 2: Japanese Patent Laid-Open No. 2004-39810

DISCLOSURE OF INVENTION

Problems that the Invention is to Solve

As described in the prior art, a high-quality GaN GaN freestanding substrate fabrication technique is desirable to truly put GaN-based elements into practical use. This requires both a technique that forms a high-quality GaN layer on a substrate made of, for example, sapphire, and a technique that separates the GaN layer from the substrate. The present inventors have shown that, although MBE growth method is used, a GaN film having high crystallinity is obtained by epitaxially growing CrN on a sapphire substrate, and subsequently growing GaN layer.

Unfortunately, it is difficult to obtain a thick GaN layer by this MBE growth method, so the method is difficult to apply a technique to fabricate the GaN GaN freestanding substrate. To increase the area and throughput, it is necessary to stack Cr on a sapphire substrate or the like by, for example, sputtering method, to form an epitaxial Cr nitride film by nitriding stacked Cr in an HVPE apparatus capable of high-speed growth and mass-production, and subsequently form a thick GaN film on the Cr nitride film.

Problems to be solved are to make the Cr nitride film, which is obtained by nitriding stacked Cr in the HVPE apparatus and serves as at least a GaN growth interface, be a single-crystal film similar to a CrN film formed by MBE growth method, and to implement a technique that detaches a GaN layer grown on the Cr nitride film by, for example, dissolving a Cr-containing layer forming the interface between the GaN layer and a substrate made of sapphire or the like.

It is an object of the present invention to obtain an industrially practical technique on the basis of the findings on MBE growth method obtained by the present inventors, thereby providing a GaN GaN freestanding substrate fabrication technique.

It is another object of the present invention to fabricate a GaN-based element using the fabricated GaN template substrate and including a light emitting element such as a light emitting diode or laser diode or an electronic element.

Means of Solving the Problems

To achieve the objects of the present invention, the present invention is a GaN single crystal growth method characterized by comprising a growth process of growing a metal buffer layer on a substrate, a nitridation process of forming a metal nitride layer by nitriding the surface or the whole of the metal buffer layer, a GaN buffer layer growth process of growing a GaN buffer layer on the metal nitride layer, and a GaN layer growth process of growing a single-crystal GaN layer on the GaN buffer layer, wherein the metal buffer layer is made of Cr or Cu.

Also, the present invention is a GaN single crystal growth method characterized by comprising a growth process of growing a metal buffer layer on a substrate, a nitridation process of forming a metal nitride layer by nitriding the surface or the whole of the metal buffer layer, a GaN buffer layer growth process of growing a GaN buffer layer on the metal nitride layer, and a GaN layer growth process of growing a single-crystal GaN layer on the GaN buffer layer, wherein the metal nitride layer has (111) orientation.

It is also possible to use a metal substrate as the substrate, and form a metal nitride layer by nitriding the surface of the metal substrate in the nitridation process.

In the GaN single crystal growth method described above, when the substrate is a substrate having a metal layer, it is possible to nitride the surface of the metal layer by using it as a metal buffer layer, or grow a metal buffer layer on the metal layer.

Note that the nitridation process is preferably performed by a gas containing ammonia. Note also that the nitriding temperature range is preferably 500° C. to 1,000° C.

It is also desirable to set the growth temperature range in the GaN buffer layer growth process at 800° C. to 1,100° C., and the thickness of the GaN buffer layer at 50 nm to 30 μm.

The present invention is also a GaN-based element fabrication method of fabricating a GaN-based element, characterized by comprising a step of fabricating a GaN-based element structure on a GaN single-crystal layer obtained by a method of growing a GaN single crystal on a metal buffer layer or a metal nitride layer, and a chip separation step of separating chips.

The method can further comprise a step of forming a conductive junction layer and a conductive substrate layer on the GaN-based element structure, the chip separation step performs a primary separation which separates the structure to the brink of the conductive substrate layer, removes the metal buffer layer or the metal nitride layer by selective chemical etching, and performs a secondary separation which separates the conductive substrate layer. With this method, it is possible to fabricate an up-down electrode type light emitting element having an upper electrode and a lower electrode.

Otherwise, as the chip separation step, at first a primary separation is performed which separates the metal nitride layer or the metal buffer layer, then a step of forming a conductive junction layer and a conductive substrate layer on the GaN-based element structure, the metal buffer layer or the metal nitride layer is removed by selective chemical etching, and a secondary separation is performed which separates the conductive substrate layer. With this method, it is also possible to fabricate an up-down electrode type light emitting element having an upper electrode and a lower electrode.

In a GaN-based element fabricated by the method of fabricating a GaN-based element on a metal buffer layer described above, an electrode may also be formed on the metal buffer layer.

Also, in the light emitting element fabricated by the method of fabricating a GaN-based element on a metal buffer layer, emitted light is reflected by the metal buffer layer. With this structure, the light emission efficiency can be increased.

In the above-mentioned GaN single crystal growth method, a GaN freestanding substrate can be obtained by first growing a thick GaN single-crystal layer, and then performing a separation step of separating the GaN single-crystal layer by selective chemical etching.

EFFECTS OF THE INVENTION

The arrangement of the present invention can grow a low-defect, high-quality GaN-based thin film (thick film) by using a metal buffer layer on a substrate made of a different kind of single crystal, a polycrystal, an amorphous semiconductor, or a metal. This GaN-based thin film (thick film) can be formed as an n-type, p-type, or undoped film.

Since a GaN template substrate including a metal buffer layer can be fabricated, a light emitting element (e.g., a light emitting diode or laser diode) or electronic element can be fabricated on the substrate.

It is also possible to fabricate a high-output, high-luminance light emitting diode by reflection of the metal buffer layer.

The GaN-based element fabrication method of the present invention makes it possible not only to improve the performance of a GaN-based element, but also to greatly improve the GaN-based element fabrication steps, thereby largely reducing the GaN-based element fabrication cost.

Since a GaN GaN freestanding substrate is fabricated by selective chemical etching of a metal buffer layer or/and a metal nitride layer, it is possible to greatly improve the fabrication process after lift-off, thereby increasing the throughput and largely reducing the fabrication process cost.

BRIEF DESCRIPTION OF DRAWINGS

FIG. 2(a) is a schematic view of a conventional flip-chip type GaN light emitting element, and FIG. 2(b) is a schematic view of a mirror-coated GaN light emitting element;

FIG. 3 shows views each showing an LED structure having a top-down electrode using a metal junction layer, in which FIG. 3(a) shows an LED (Light Emitting Diode) structure grown as a thin film on a sapphire substrate, FIG. 3(b) shows the way a Si substrate is connected by using the metal junction layer, FIG. 3(c) shows the way the sapphire substrate and thin film are separated, and FIG. 3(d) shows a top-down electrode type, high-luminance LED (Light Emitting Diode) structure;

FIG. 5-1 shows a table of the physical properties of a buffer layer and the like used when growing a GaN layer, that is, shows the interatomic distances and thermal expansion coefficients of GaN growth buffer layers/substrate materials;

FIG. 5-2 is a schematic view showing crystal growing mechanisms on sapphire and CrN;

FIG. 7-1 shows photographs each showing the surface morphology of a GaN layer grown on Cr when the nitriding temperature of Cr was changed, that is, FIG. 7-1(a) shows the case that the nitriding temperature was 480° C., FIG. 7-1(b) shows the case that the nitriding temperature was 520° C., FIG. 7-1(c) shows the case that the nitriding temperature was 800° C., FIG. 7-1(d) shows the case that the nitriding temperature was 980° C., and FIG. 7-1(e) shows the case that the nitriding temperature was 1,040° C.;

FIG. 7-2 is a table showing the relative evaluations concerning the surface morphology and crystallinity of a high-temperature GaN layer with respect to the nitriding temperature of Cr;

FIG. 8 is an SEM sectional photograph of a sample obtained by growing a 5-μm thick GaN buffer layer at a temperature of 800° C. to 1,000° C. after a metal buffer layer was nitrided;

FIG. 8-1 shows photographs each showing the surface morphology of a GaN layer grown on a GaN buffer layer with respect to the growth temperature of the GaN buffer layer, that is, FIG. 8-1(a) shows the case that the nitriding temperature was 650° C., FIG. 8-1(b) shows the case that the nitriding temperature was 700° C., FIG. 8-1(c) shows the case that the nitriding temperature was 800° C., FIG. 8-1(d) shows the case that the nitriding temperature was 900° C., FIG. 8-1(e) shows the case that the nitriding temperature was 1,000° C., FIG. 8-1(f) shows the case that the nitriding temperature was 1,100° C., FIG. 8-1(g) shows the case that the nitriding temperature was 1,150° C., and FIG. 8-1(h) shows the case that the nitriding temperature was 1,200° C.;

FIG. 8-2 shows the relative comparison between the crystallinity of GaN layers with respect to the growth temperature of a GaN buffer layer;

FIG. 8-3 is a table showing the relative evaluations of GaN layers grown on GaN buffer layers with respect to the growth temperatures of the GaN buffer layers;

FIG. 8-4 is a graph showing the relative comparison between the crystallinity of GaN layers with respect to the thickness of a GaN buffer layer;

FIG. 9 shows graphs of the X-ray rocking curves of GaN layers;

FIG. 13a is a sectional view showing a light emitting element grown on a GaN template substrate including a metal buffer layer;

FIG. 13b is a sectional view showing a structure obtained by connecting a conductive substrate on a GaN-based light emitting element structure by using a conductive junction layer;

FIG. 14(a) is a sectional view showing chip separation by primary scribing or dry etching, FIG. 14(b) is a sectional view showing a structure obtained by connecting a conductive substrate on the surfaces of a light emitting element and electronic element having undergone chip separation by using a conductive junction layer, and FIG. 14(c) is a sectional view showing separation of a sapphire substrate by selective chemical etching of a metal buffer layer;

FIG. 15(a) is a sectional view of a high-output, high-efficiency light emitting element obtained by reflection of the metal buffer layer, and FIG. 15(b) is a sectional view of another high-output, high-efficiency light emitting element obtained by reflection of the metal buffer layer;

FIG. 16 is a graph showing the results (calculated values) of simulation of the reflectance and transmittance obtained by the change in thickness of a metal buffer layer when the light emission wavelength is 460 nm;

FIG. 18 is a graph showing the measurement value (experimental value) of the reflectivity (reflectance) with respect to the light emission wavelength in a sample formed by setting the thickness of a Cr metal buffer layer to 100 Å (10 nm);

FIG. 19 shows views of the fabrication of a GaN freestanding substrate by selective chemical etching of a metal buffer layer, in which FIG. 19(a) is a sectional view when a thick GaN film is grown on the metal buffer layer by HVPE method, and FIG. 19(b) is a sectional view showing the way a sapphire substrate and the thick GaN layer (freestanding substrate) are separated by selective chemical etching of the metal buffer layer;

FIG. 21 shows views of a method of growing a thick GaN layer on a Cu substrate, in which FIG. 21(a) is a sectional view showing a structure in which a GaN template substrate including no Cu metal buffer layer is formed on the Cu substrate, and a light emitting element structure is formed on the GaN template substrate, and FIG. 21(b) is a sectional view showing a structure in which a GaN template substrate including a Cu metal buffer layer is formed on the Cu substrate, and a light emitting element structure is formed on the GaN template substrate.

EXPLANATION OF REFERENCE NUMERALS

Figure 1:
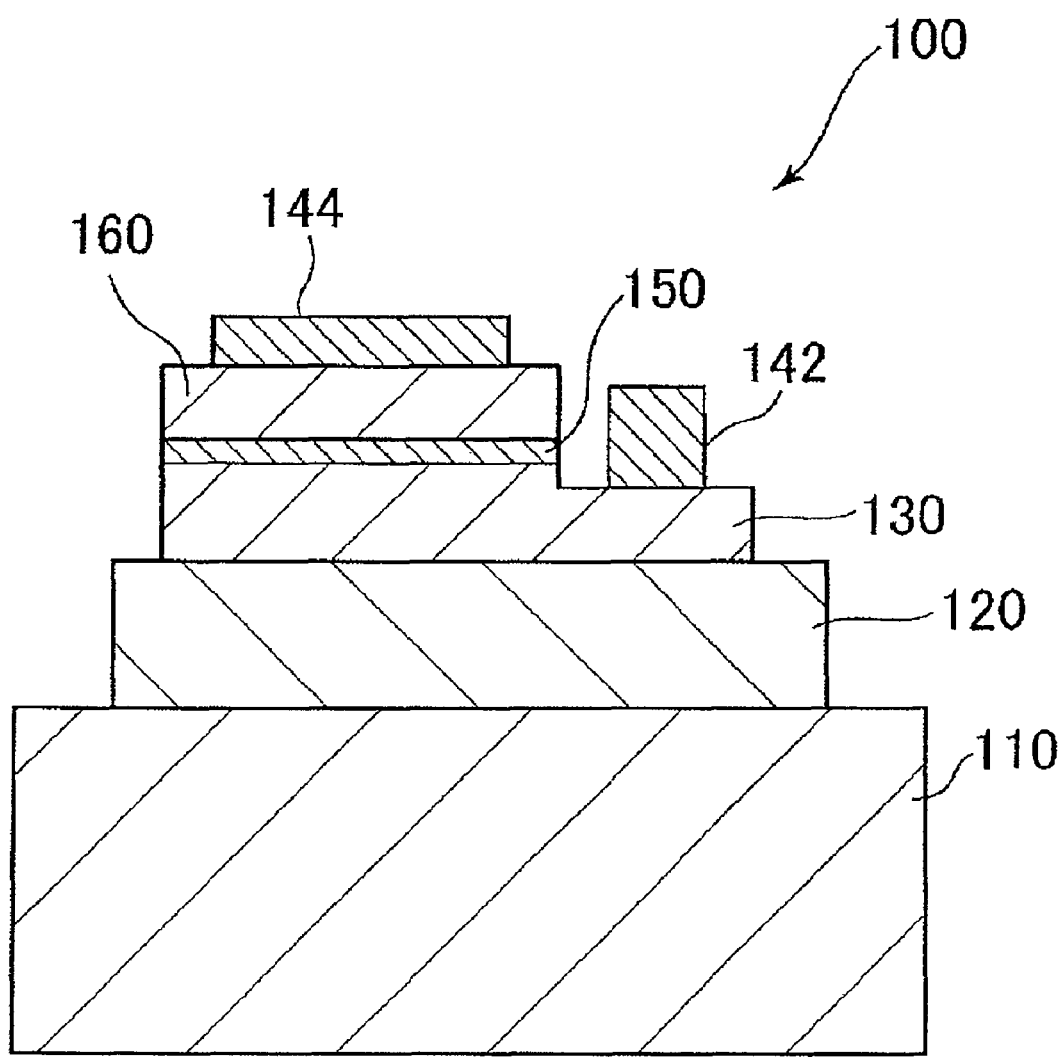
FIG. 1 is a schematic view of a conventional GaN light emitting element.

100: GaN-based element
110: Submount layer
120: Sapphire substrate
122: Patterned sapphire substrate
125: Cu substrate
130: N-GaN layer
142: N-type electrode
144: P-type electrode
150: Active layer (InGaN QW layer)
160: P-GaN layer
172, 174: Interconnection
176, 178: Au bump
180: Metal mirror coating layer
182: Metal junction layer
190: Si substrate
210: Metal buffer layer
212: Metal nitride layer
220: GaN single-crystal layer
222: GaN buffer layer

224: Thick GaN layer
230: Conductive substrate
232: Conductive junction layer
300: Light emitting element structure
400: GaN template substrate
501: Chip
502: Trench formed by scribing
600: Region to be etched

BEST MODE FOR CARRYING OUT THE INVENTION

The present invention forms a metal buffer layer on a different kind of single-crystal substrate, a polycrystalline substrate, an amorphous substrate, or a metal substrate, in addition to a sapphire substrate and SiC substrate, by electron beam evaporation method (E-beam evaporator), thermal evaporation method (Thermal evaporator), sputtering method (Sputter), chemical vapor deposition method (Chemical Vapor Deposition), or metal organic chemical vapor deposition (MOCVD), and then grows single-crystal GaN on the metal buffer layer. It is the first attempt to use a metal as a buffer layer on various substrates, and fabricate a light emitting element or electronic element on the metal buffer layer. This makes it possible to provide various structures and various substrates of GaN-based light emitting elements in the future. Since the metal buffer layer is inserted in the interface between any of various substrates such as a sapphire substrate or SiC substrate and a GaN-based single-crystal thin film (thick film), it is possible to prevent light generated by an active layer of a light emitting element from transmitting through the sapphire substrate, and increase the extraction efficiency of light emission by reflection of the metal buffer layer in the interface. It is also possible to efficiently separate the light emitting element or an electronic element from the substrate by selective chemical etching of the metal buffer layer or a metal nitride layer in the interface, thereby forming a top-down electrode.

The following can be pointed out as the important elemental techniques of the present invention.

1) The technique that forms a nitridable metal layer.
2) The nitridation technique that forms GaN growth nuclei on the metal buffer layer in a reaction tube of HVPE or in a chamber of MOCVD or MBE.
3) The technique that grows a GaN buffer layer on the metal buffer layer.
4) The technique that grows a GaN single-crystal layer.
5) The technique that separates the substrate and GaN layer by selective chemical etching of the metal buffer layer or a metal nitride layer.
6) The technique that, on the GaN single-crystal thin film (thick film) thus formed, forms a light emitting element such as an InGaN/GaN blue light emitting diode, GaN/AlGaN ultraviolet light emitting diode, or laser diode, or an electronic element.
7) The technique that fabricates various optical elements, such as a high-luminance light emitting diode and flip-chip using reflection of the metal interface layer, and a top-down electrode type light emitting element obtained by selective chemical etching of the metal buffer layer.
8) The technique that performs primary chip separation in a scribing step after formation of the optical or electronic element structure, and then performs selective chemical etching of the metal buffer layer. This makes it possible to suppress the generation of cracks, and significantly increase the throughput of the element.
9) The technique that fabricates a GaN freestanding substrate by selective chemical etching of the metal buffer layer.

Embodiments of the present invention will be explained in detail below with reference to the accompanying drawings.

First, an outline of a method of forming a GaN single-crystal layer by using a metal buffer of the present invention will be explained with reference to FIG. 5.

Figure 5:
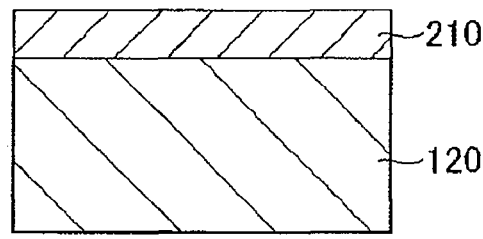
FIG. 5 shows views of a method of forming a GaN single-crystal layer by using a metal buffer layer of the present invention.
Figure 5:
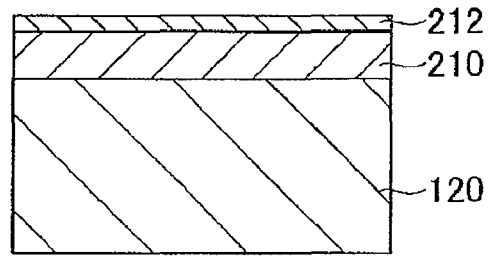
Figure 5:
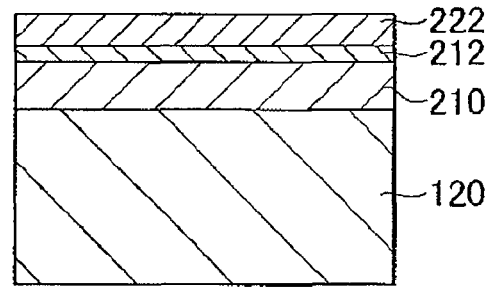
Figure 5:
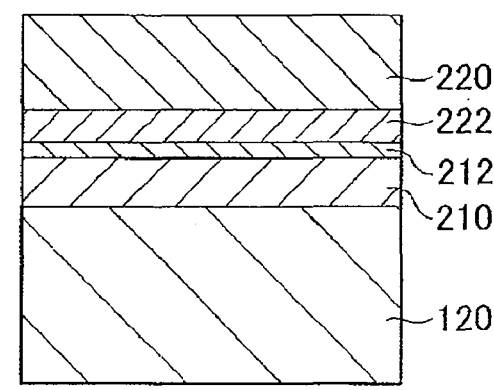

1) A nitridable metal layer (metal buffer layer) 210 made of, for example, Cr or Cu is formed to have a predetermined thickness (a few nm to a few µm) on a sapphire substrate 120 by vacuum vapor deposition method (E-beam evaporator or thermal evaporator), sputtering method (Sputter), metal organic chemical vapor deposition method (MOCVD), chemical vapor deposition method (Chemical Vapor Deposition), or MBE method (Molecular Beam Epitaxy) (FIG. 5(*a*)).

In case of vacuum vapor deposition method, the substrate temperature is room temperature or less to 1,000° C., and a gas to be used in sputtering method is preferably Ar or nitrogen. In case of chemical vapor deposition method, it is possible to use an alkyl compound or chloride containing a predetermined metal.

2) A substrate in which the metal buffer layer 210 is vapor-deposited on the sapphire substrate 120 is nitrided to form nuclei of GaN crystal growth.

Ammonia gas can be used when using MOCVD method and HVPE method as GAN crystal growth methods, and ammonia or nitrogen plasma can be used when using MBE method.

Nitridation process is preferably performed in an ammonia gas ambient or an ammonia gas-containing hydrogen or nitrogen gas ambient at a substrate temperature of 500° C. to 1,000° C. A strong reducing function of ammonia can nitride the surface of the metal buffer layer even when the metal buffer layer has a surface oxide layer. Optimum nitriding conditions for forming a uniform metal nitride on the surface of the metal buffer layer, that is, the flow rate of ammonia and the nitriding temperature are determined.

This nitridation can form a metal nitride, that is, $Cr_xN_y$ or $Cu_xN_y$ in the case of Cr or Cu used in the embodiment, on the surface of the metal buffer layer by a predetermined thickness in accordance with the conditions of nitriding the surface of the metal buffer layer vapor-deposited in step 1). In this case, the whole metal buffer layer can be formed into a metal nitride by controlling the nitriding conditions.

This process can be performed in a reaction tube of an HVPE growth system or MOCVD growth system, or in a MBE chamber.

The metal nitride thus formed can function as a nucleus of GaN crystal growth. This will be explained in detail below with reference to a table of FIG. 5-1 showing the physical properties of buffer layers and the like used to grow GaN layers, and a schematic view of FIG. 5-2 showing the growth of crystals on sapphire and CrN.

It is well known that when a GaN film is grown on the (0001) plane of sapphire, the GaN film grows with a domain in which the crystal axis of the GaN film rotates 30° in the (0001) plane with respect to the corresponding crystal axis of sapphire. Because the 30° rotation described above reduces the lattice mismatching between sapphire and GaN. Even in this case, however, the lattice mismatching is as large as 16.1% and causes crystal defects in the GaN layer (see FIG. 5-1).

Figure 2:
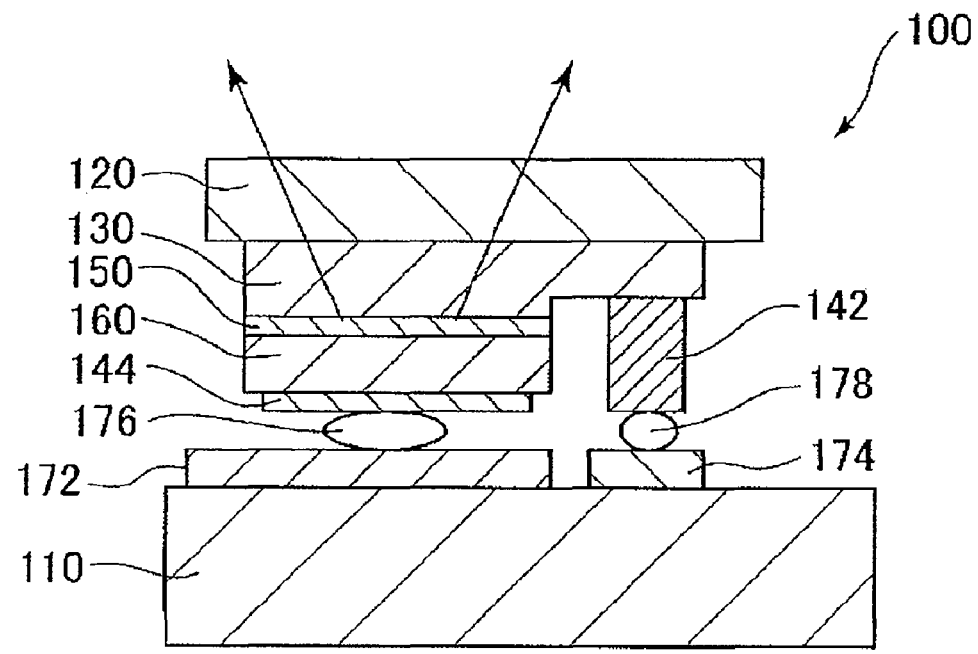
Figure 2:
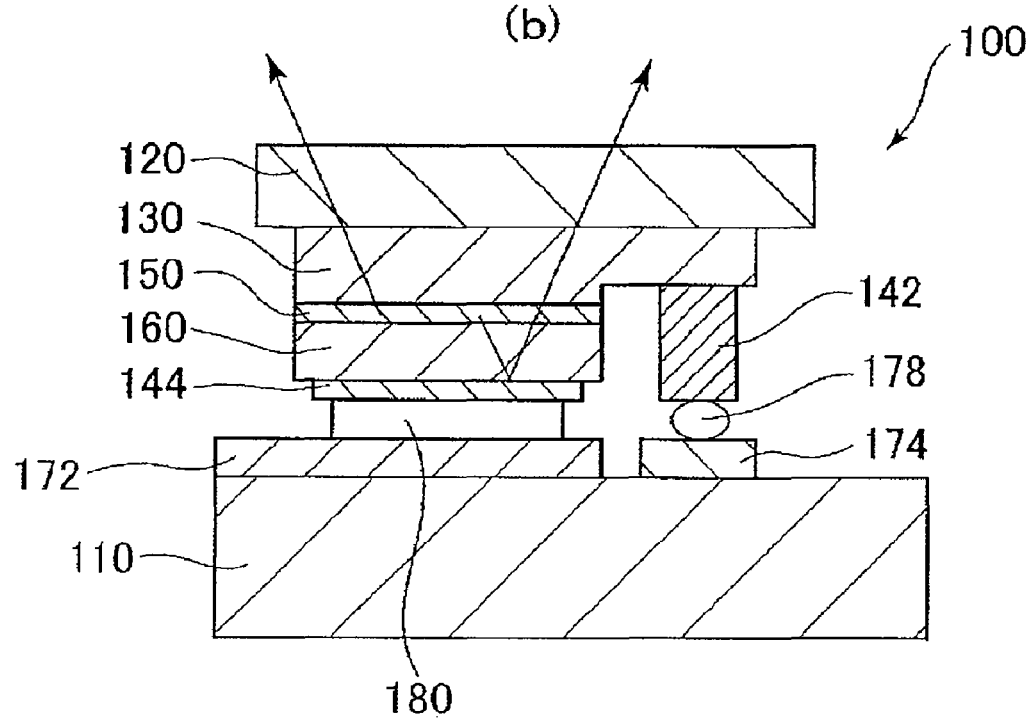

When Cr is vapor-deposited on the (0001) plane of sapphire, Cr having a face-centered cubic structure shows (110) orientation. Cr forms CrN having a rock salt structure by nitriding, and shows (111) orientation. When GaN is grown on this (111) plane of CrN, the lattice constant of the (111)

plane of CrN has an intermediate value between the lattice constant of the (0001) plane of GaN and the lattice constant of the (0001) plane of sapphire that has rotated 30° (see FIG. 5-1).

That is, as shown in FIG. 5-2, when GaN is grown on an ideal (111) plane of CrN formed on a c-plane sapphire substrate, the lattice mismatching is 6.6% between the CrN (111) plane and c-plane sapphire, and 8.9% between the GaN (0001) plane and CrN (111) plane, that is, the lattice mismatching can be reduced step by step compared to the case that GaN is directly grown on c-plane sapphire (the lattice mismatching is 16.1%). This suppresses the formation of crystal defects compared to the case that GaN is directly grown. In addition, CrN has a thermal expansion coefficient of $6.00 \times 10^{-6}$ [/K], and this value is also an intermediate value between GaN and sapphire. A difference in thermal expansion at GaN (/a buffer layer)/the substrate interface(s) generates cracks in a thick GaN film on a sapphire substrate when the temperature decreases. However, the use of CrN as the buffer layer can presumably reduce the cracks because the thermal expansion coefficient difference can be reduced stepwise. On the other hand, as shown in FIG. 5-1, the relationship between the thermal expansion coefficients of AlN and TiN is AlN (0001)<GaN (0001)<CrN (111)<$Al_2O_3$ (0001) <TiN (111), so AlN and TiN cannot reduce the thermal expansion coefficient difference stepwise.

From the foregoing, the crack reducing effect obtained by the stepwise reductions in lattice mismatching and thermal expansion coefficient difference cannot be obtained by the conventional metal nitride film of Al and Ti (AlN and TiN) described in patent references 1 and 2; the crack reducing effect is one merit of using CrN as a buffer layer.

3) A GaN buffer layer 222 is grown on the nitrided metal buffer layers 210 and 212 (FIG. 5(c)). Note that, when the whole metal buffer layer is nitrided, 210 is entirely replaced with 212.

4) Finally, a GaN single-crystal layer 220 is grown (FIG. 5(d)).

The GaN single-crystal layer 220 can be grown to have various thicknesses in accordance with the purposes. The substrate fabricated by the above-mentioned steps can be used as a GaN template substrate for fabricating a GaN-based light emitting diode or laser diode.

As a substrate for growing the metal buffer layer, it is possible to use a single-crystal or polycrystalline semiconductor substrate such as $Al_2O_3$, Si, SiC, or GaAs, or a single-crystal or amorphous substrate such as Nb, V, Ta, Zr, Hf, Ti, Al, Cr, Mo, W, Cu, Fe, or C.

Also, as a metal layer used as the metal buffer layer, it is possible to use a nitridable metal such as Ga, Nb, V, Ta, Zr, Hf, Ti, Al, Cr, Mo, W, or Cu.

As described above, various metals can be used as the metal buffer layer. However, the nitriding conditions such as the temperature conditions are narrow depending on the type of metal, and this poses the problem of reproducibility. For example, the reproducibility of Ti is low because hydrogen absorption occurs during nitriding using $NH_3$, and desorption of hydrogen absorbed during nitriding and during later GaN growth occurs. This probably makes it impossible to obtain a flat nitride layer necessary for the present invention with high reproducibility.

From the viewpoint of reproducibility, Cr and Cu described in the embodiment are most favorable as the metal buffer layer. This result corresponds to the fact that the metal buffer layer made of Cr or Cu is always flat as seen in an SEM sectional photograph shown in FIG. 8.

From the foregoing, the metal buffer layer is preferably Cr or Cu, and more preferably, Cr.

As a GaN-based single crystal, it is possible to grow a GaN-based thin film (thick film), that is, GaN, $In_xGa_{1-x}N$, $Al_xGa_{1-x}N$, or $Al_xIn_yGa_{1-x-y}N$. This GaN-based thin film (thick film) can be formed as an n-type, p-type, or undoped film.

Also, MOCVD method, MBE method, or HVPE method can be used as a method of growing a GaN buffer layer and GaN single crystal via nitridation process after a nitridable metal layer (metal buffer layer) is formed on a different kind of substrate. After the GaN single-crystal layer is formed, GaN layer can be separated from the substrate by selective chemical etching of the metal buffer layer.

The fabrication process will be explained in detail below as an embodiment practiced by using the HVPE growth technique. Note that it is of course also possible to perform the following growth process by using MOCVD method or the like by appropriately changing the growth conditions.

1) Vapor Deposition of Metal Buffer Layer on Sapphire Substrate (FIG. 5(a))

Cr or Cu as a metal buffer layer is formed to have a predetermined thickness (a few nm to a few μm) on a sapphire substrate by vacuum vapor deposition method (E-beam evaporator or thermal evaporator), sputtering method (Sputter), metal organic chemical vapor deposition method (MOCVD), or chemical vapor deposition method (CVD). The thickness of the formed metal buffer layer has a close relationship with the application to a light emitting element and the selective chemical etching rate. In this embodiment, Cr or Cu having a thickness of a few hundred Å (a few ten nm) was used as the metal buffer layer. To increase the connecting force between the substrate and metal buffer layer and improve the surface flatness, the substrate temperature during the formation was room temperature to 1,000° C. The thickness of the formed metal was about 10 to 1,000 Å (1 to 100 nm).

For example, a Cr film formed by sputtering method is polycrystalline as indicated by X-ray diffraction data (Sputtered Cr metal) shown in FIG. 6(a). Note that the Cr surface oxide layer is very thin and amorphous, and hence cannot be sensed by X-ray diffraction. Electron microscopic observation shows that when the Cr film thickness is decreased to about 4 nm, a crystalline Cr film grows, but a multi-domain structure is obtained as a whole. Note also that a single-crystal Cr film grows when Cr is stacked in an ultrahigh vacuum by using MBE method.

Figure 7:
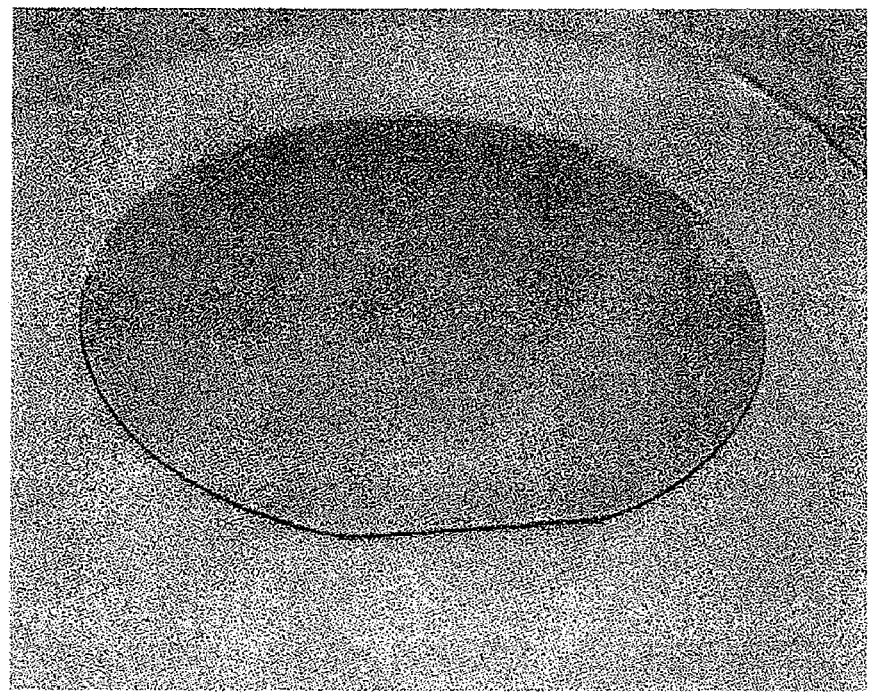
FIG. 7 is a photograph showing a Cr metal buffer layer vapor-deposited on a 2-inch sapphire substrate by sputtering.

FIG. 7 shows a photograph of Cr vapor-deposited on a 2-inch sapphire substrate.

2) Nitridation of Metal Buffer Layer (FIG. 5(b))

The formed metal buffer layer was nitrided in a quartz reaction tube by using the HVPE growth method.

A metal nitride layer 212 was formed by performing nitridation in an ammonia gas ambient at a temperature of 600° C. or more. FIG. 6(a) shows X-ray diffraction data (CrN in N and CrN in Ar) including this result. That is, FIG. 6(a) shows the data of a sputtered Cr film, a nitrided Cr film (CrN in Ar), a nitrided Cr film (CrN in N), and a CrN film grown by MBE method in this order from below. As shown in FIG. 6(a), this nitridation forms (111) CrN. That is, a strong reducing function of ammonia gas reduced and nitrided the Cr oxide on the Cr surface, thereby growing CrN. FIG. 6(b) is a schematic view showing the nitrided structure.

Note that CrN in N and CrN in Ar shown in FIG. 6(a) compare the results of nitridation of Cr films formed by sputtering by using nitrogen and Ar as sputtering gases. The uppermost X-ray diffraction data (MBE-CrN) is the X-ray diffraction data of a CrN film formed on a sapphire substrate by MBE method, and indicates the growth of a (111) single crystal.

Figure 6:
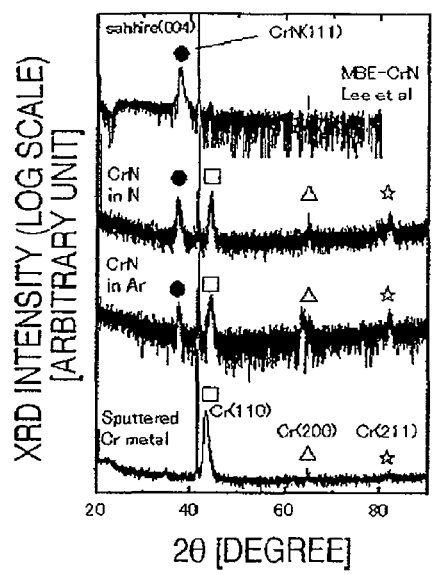
FIG. 6 shows views of X-ray diffraction data of Cr films formed by various methods.
Figure 6:
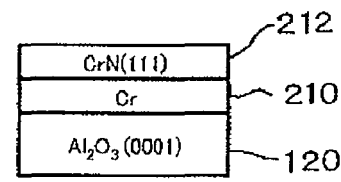

The X-ray diffraction data shown in FIG. 6 of this CrN layer formed by nitriding has no peak except for (111) orientation. It is possible to determine from the diffraction data that the <111> axis was oriented in the CrN layer. This result agrees with the SEM sectional image shown in FIG. 8 in which the interface between GaN and the metal nitride layer is flat. That is, this proves that the fabrication method of the present invention can form a metal nitride layer without forming any multi-domain.

Note that (111) orientation described above means that the <111> axis is oriented.

A comparison of CrN grown by MBE method with nitrided Cr reveals that diffraction peaks from not only CrN but also Cr are observed from nitrided Cr, indicating that CrN is formed on the Cr film by nitridation.

Various Cr nitriding temperature conditions will be explained in detail below.

First, when the temperature was 500° C. or less, the ratio of decomposition of ammonia gas into nitrogen and hydrogen was low, so the formation of CrN by nitriding of Cr was difficult. Consequently, no GaN buffer layer grew on the surface of Cr nitrided at 500° C. or less.

In addition, when GaN was grown on the Cr surface at a high temperature, the surface morphology was rough in a three-dimensional growth mode. At a temperature of 1,000° C. or more, Cr attached on the sapphire substrate started evaporating, and a GaN layer grown on Cr abnormally grew to form giant pits. This deteriorated the crystallinity of a GaN film formed on the GaN layer.

FIG. 7-1 shows photographs of the surface morphologies of GaN layers grown on Cr when the nitriding temperature was changed. FIGS. 7-1(a), 7-1(b), 7-1(c), 7-1(d), and 7-1(e) respectively illustrate the results of nitriding at 480° C., 520° C., 800° C., 980° C., and 1,040° C. FIG. 7-2 is a table relatively comparing the surface morphology and crystallinity (indicated by the half-width of (0002) XRD) of the GaN layer with the nitriding temperature of Cr. As shown in FIG. 7-2, the surface morphology and crystallinity of the GaN buffer layer were bad at about 500° C. or less, were optimum at 980° C., and deteriorated at 1,000° C. or more.

As is also apparent from the photographs of the surfaces shown in FIGS. 7-1, a flat, mirror-surface GaN film can be formed on a metal film nitrided under good conditions.

From the foregoing, the nitriding temperature of the metal buffer layer is preferably 500° C. to 1,000° C., and more preferably, 800° C. to 1,000° C.

A favorable GaN film can be formed on the surface morphology of the nitrided metal buffer only when an almost continuous metal nitride film is formed, although that depends upon the metal growth conditions, metal film thickness, and nitriding conditions. "An almost continuous metal nitride film" is a continuous film having a domain-like surface morphology in which voids are formed between domains when observed with an SEM or the like, but the area of the uppermost surface of the domain is larger than that of the void, and the domain surface is flat. This film looks like a continuous film on the optical microscopic level.

Next, the conditions under which this mirror surface is obtained by nitridation will be described below. When a gas containing ammonia is used in nitridation process, H atoms are generated during the nitridation process, and a hydrogen storing metal (representative examples are Ti and Ta) forms voids inside crystals as a result of desorption of hydrogen. This causes large three-dimensional surface roughness after nitridation. That is, it is difficult for a hydrogen storing metal to form "an almost continuous metal nitride film" described above after the metal buffer layer is nitrided. Therefore, this embodiment uses Cr that is not a hydrogen storing metal.

3) Growth of GaN Buffer Layer in HVPE Reaction Tube (FIG. 5(c))

As described above in step 2), a GaN buffer layer was grown on the nitrided metal buffer layer in the HVPE reaction tube. In this embodiment, the growth temperature range of the GaN buffer layer was 800° C. to 1,000° C. higher than the growth temperature of the conventional low-temperature GaN buffer layer. The thickness of the GaN buffer layer was set at a few nm to a few ten μm in accordance with the growth conditions.

FIG. 8 is an SEM sectional photograph of a sample obtained by growing a 5-μm thick GaN buffer layer at 800° C. to 1,000° C. after nitridation of the metal buffer layer. It was possible to grow columnar crystals.

When the MOCVD growth method was used, the growth temperature range was set at 500° C. to 1,000° C., and the thickness was set at a few nm to a few μm.

Note that the GaN buffer layer can be any of n-type, p-type, and undoped GaN.

Practical GaN buffer layer formation conditions will be explained below.

a) Growth Temperature of GaN Buffer Layer

The growth temperature of the GaN buffer layer had large influence on the surface morphology and crystallinity of the GaN layer.

FIG. 8-1 shows photographs of the surface morphologies of GaN buffer layers when the growth temperatures were 650° C., 700° C., 800° C., 900° C., 1,100° C., 1,150° C., and 1,200° C. These photographs indicate that the surface morphology exhibited no compatibility and had a polycrystalline shape when the temperature was 650° C., and had a large number of pits when the temperature was 1,100° C.

FIG. 8-2 is a graph comparing between the crystallinity of the GaN layers with respect to the growth temperature of the GaN buffer layer. FIG. 8-2 shows that the crystallinity was relatively high when the growth temperature was 800° C. to 1,100° C. Conventionally, a method of growing a low-temperature GaN buffer layer at a temperature of 500° C. to 700° C. in order to grow GaN crystals is generally known. By contrast, this embodiment is characterized by using a GaN buffer layer at 800° C. or more.

Figure 3:
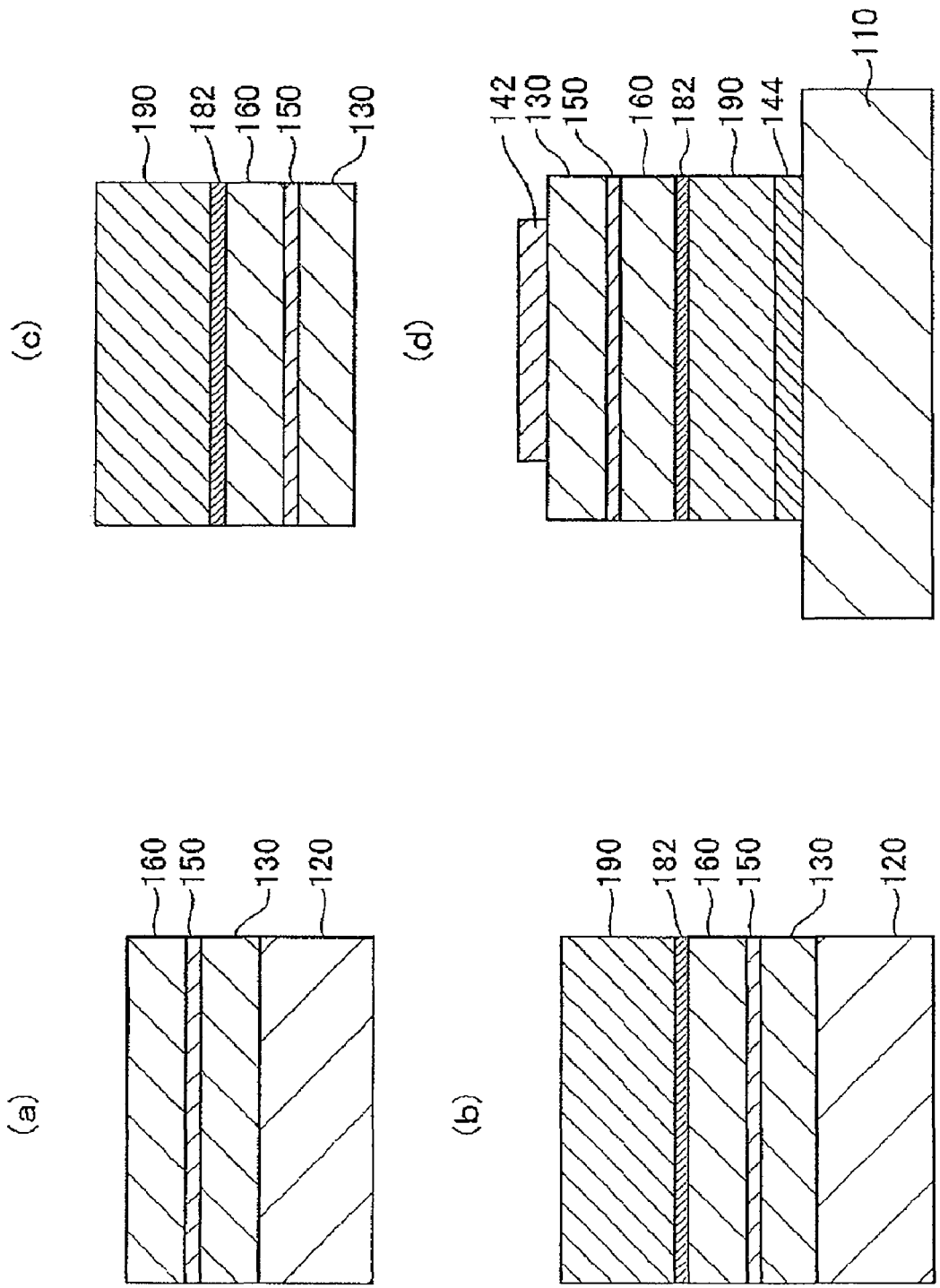

FIG. 8-3 shows a table relatively comparing between the surface morphology and crystallinity of the GaN layers with respect to the growth temperature of the GaN buffer layer. As shown in FIG. 8-3, it is favorable to grow the GaN buffer layer at about 800° C. to 1,000° C., particularly, about 900° C.

From the foregoing, the growth temperature range of the GaN buffer layer growth process is preferably 800° C. to 1,100° C., and more preferably, 800° C. to 1,000° C.

b) Thickness of GaN Buffer Layer

The thickness of the GaN buffer layer can be widely selected by the growth method. When MOCVD method is used, good GaN crystals can be obtained even when the thickness is a few ten nm or more. When HVPE method enabling a growth rate higher than MOCVD method is used, a GaN buffer can be grown from a few μm to a few ten μm. In reality, however, it is difficult for HVPE method having a growth rate of 100 μm/hr or more to control the thickness of the GaN buffer layer to 10 nm or less. Also, if the thickness of the GaN buffer layer is as small as a few ten nm or less, many pits are formed in the surface of the GaN layer, and the crystallinity deteriorates as well, so the thickness is preferably 50 nm or more. When HVPE method was used, the surface morphology and crystallinity of the GaN layer changed in accordance with the thickness of the GaN buffer layer.

Figure 4:
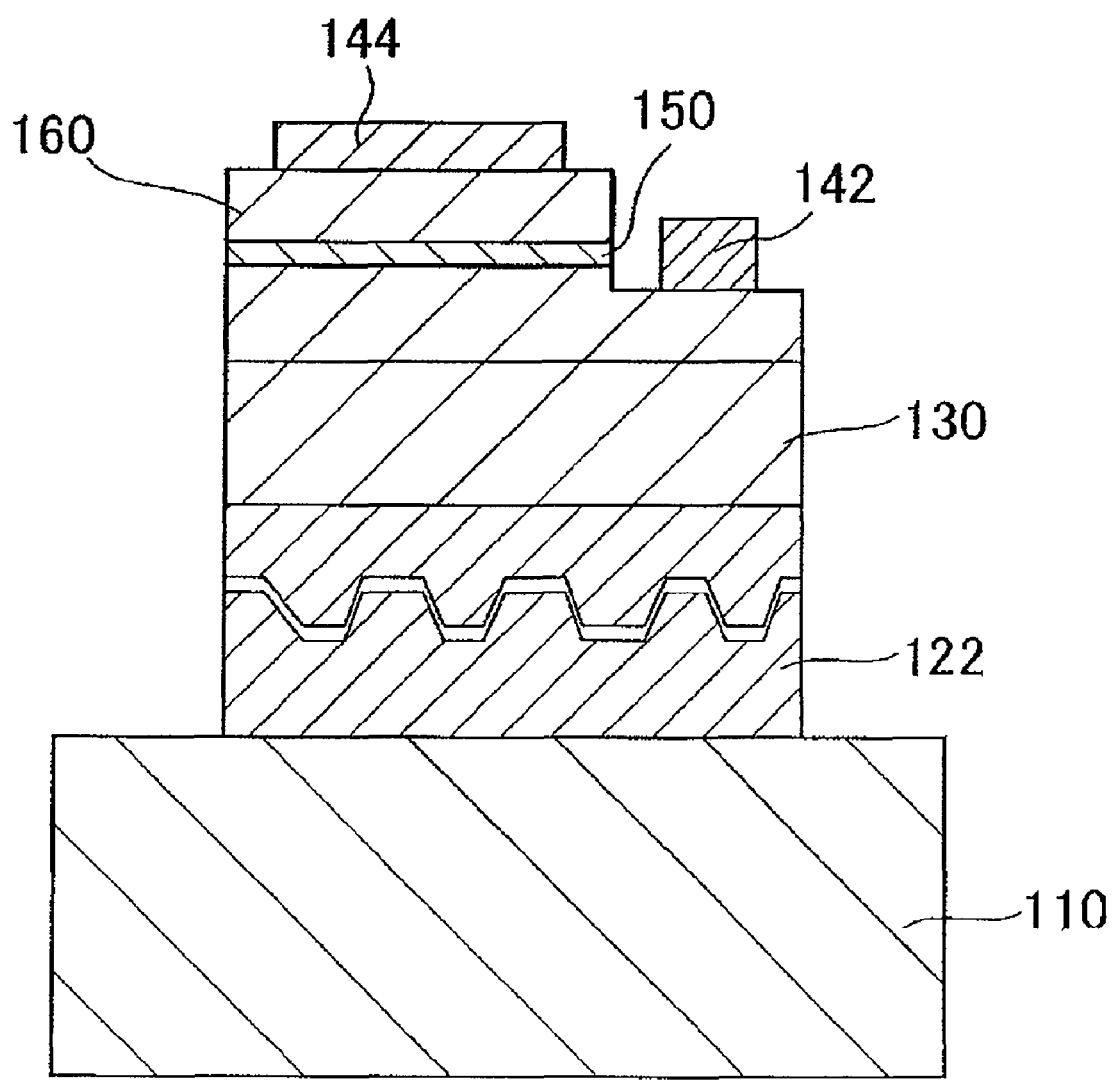
FIG. 4 is a schematic view showing the structure of a light emitting element in which fine patterns of a sapphire substrate increase the amount of light emitted from the element by irregular reflection, thereby increasing the light emission efficiency.

FIG. 8-4 shows the crystallinity of the GaN layer as a function of the thickness of the GaN buffer layer grown by HVPE method. The smallest thickness (the leftmost point) of the measured GaN buffer layer was 20 nm, and the next film thickness (the next point) was 50 nm.

This graph reveals that the crystallinity was relatively stable when the thickness of the GaN buffer layer was 50 nm to 30 μm. When the GaN buffer layer thickness was less than 50 nm or larger than 30 μm, a uniform GaN buffer layer was difficult to form, and the crystallinity deteriorated.

From the foregoing, the thickness of the GaN buffer layer grown in the GaN buffer layer growth process is preferably 50 nm to 30 μm.

In this embodiment, a metal such as Cr or Cu that hardly absorbs hydrogen is used as the metal buffer layer, so voids (air holes) as described in patent reference 2 are not formed in the interface between the metal buffer layer and GaN buffer layer, and the GaN buffer layer is flat. Note that in patent reference 2, Ti that easily occludes hydrogen is used as the metal buffer layer.

4) Growth of GaN Single-Crystal Film in HVPE Reaction Tube (FIG. 5(d)).

After the growth of the GaN buffer layer obtained in step 3) described above, a high-temperature GaN single crystal was successively grown at 1,000° C. or higher than the growth temperature of the GaN buffer layer. This high-temperature GaN single-crystal film can be grown within a wide thickness range in accordance with the purpose. When the object is a GaN freestanding substrate, a thick film having a thickness of 100 μm or more can be grown. For a flip-chip type or top-down electrode type light emitting element, the film thickness is preferably a few nm to a few ten μm.

FIG. 9 illustrates the X-ray diffraction data of a grown 25-μm thick GaN layer. FIG. 9(a) shows the (0002) rocking curves, and FIG. 9(b) shows the (10-11) rocking curves, in each of which the Cr buffer layer film thickness was changed. The (0002) peak reflects spiral dislocation, and the (10-11) peak reflects spiral dislocation+edge dislocation.

Under the nitriding conditions (ammonia was supplied to the reaction tube at 620° C., and the temperature was raised to the GaN crystal growth temperature (in this example, 1,040° C.) over about 30 min, and kept at the growth temperature for 30 min) of the example shown in FIG. 9, the optimum Cr buffer film thickness was found to be 10 to 20 nm.

The half-width of this X-ray diffraction was equivalent to that of a GaN film similarly grown by HVPE method on a GaN template formed on a sapphire substrate by MOCVD method, indicating the growth of a high-quality, single-crystal film. Note that the optimum nitriding conditions change in accordance with the film thickness of Cr.

Figure 10:
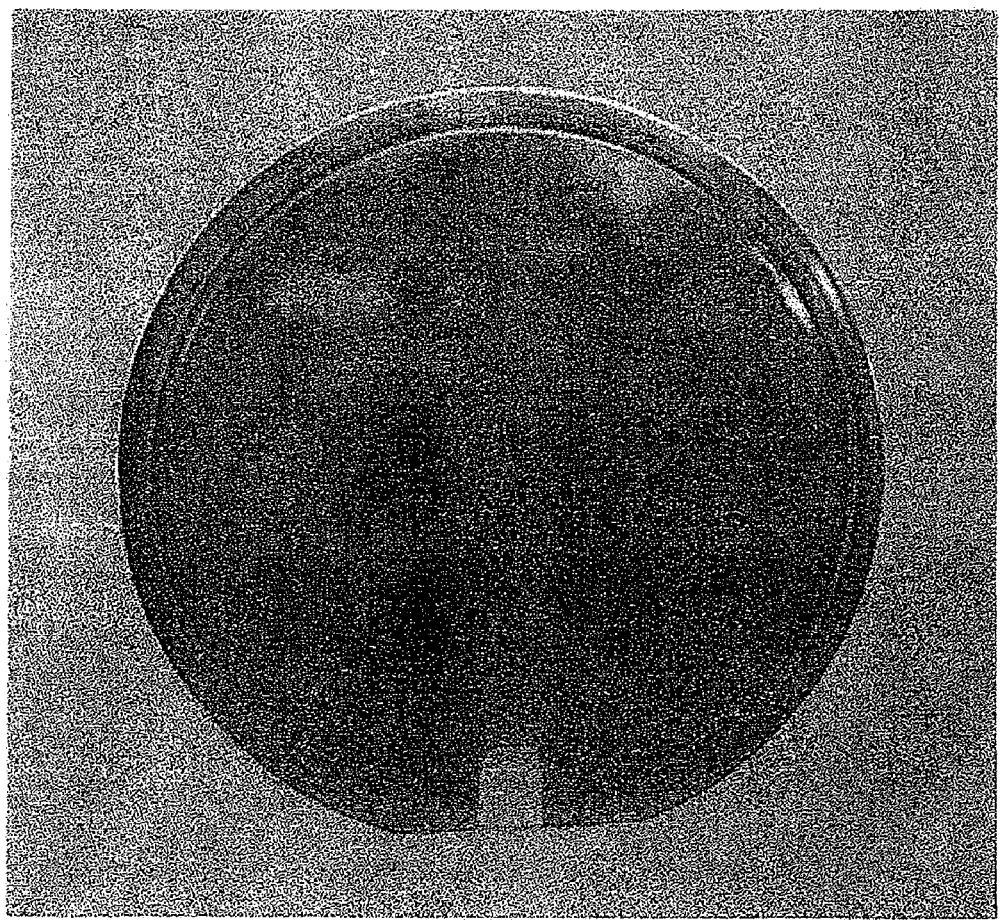
FIG. 10 is a photograph showing a GaN single-crystal film grown after nitriding a Cr metal buffer layer, and growing a GaN buffer layer on the Cr metal buffer layer, that is, a photograph showing a GaN single-crystal film grown on a Cr metal buffer layer by HVPE method.

FIG. 10 is a photograph of a structure in which a Cr metal buffer layer was nitrided on a 2-inch sapphire substrate, a GaN buffer layer was grown by HVPE method on the nitrided Cr metal buffer layer, and a high-temperature GaN single-crystal film was grown on the GaN buffer layer. In this case, it was possible to obtain a flat mirror surface.

Note that similar results were obtained even when MOCVD method using ammonia and TMG as materials was used in the growth process of a high-temperature GaN single crystal. In this case, the growth temperature was 1,000° C. or more.

Figure 11:
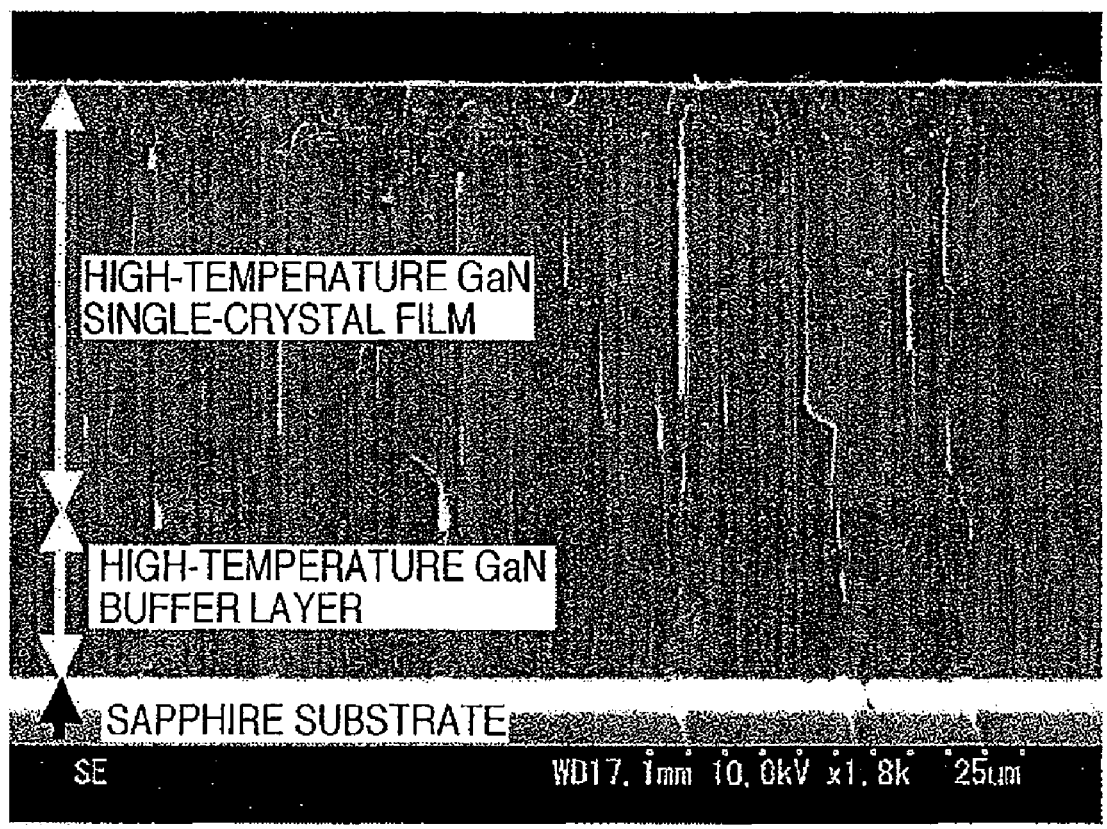
FIG. 11 is an SEM sectional photograph of a sample obtained by growing a 14-μm thick GaN buffer layer and 30-μm thick GaN single-crystal layer on a sapphire substrate in the process of forming and nitriding a Cr metal buffer layer.

Also, FIG. 11 shows an SEM sectional photograph of a structure obtained by growing a 14-μm thick GaN buffer layer and 30-μm thick high-temperature GaN single-crystal layer. This photograph clearly shows the interface between the GaN buffer layer and high-temperature GaN single-crystal layer. The high-temperature GaN single-crystal layer can be variously grown to have a thickness of a few μm to a few hundred μm in accordance with the object of application. It is also possible to grow n-type, undoped, or p-type GaN.

A GaN substrate obtained by vapor-depositing a metal buffer layer on a sapphire substrate and growing high-temperature, high-quality, single-crystal GaN by HVPE method in the fabrication process from steps 1) to 4) described above can be used as a GaN template substrate for fabricating a GaN-based light emitting diode or laser diode.

<Fabrication of Light Emitting Element or Electronic Element on GaN Template Substrate>

Various element structures such as a blue InGaN/GaN light emitting diode, ultraviolet GaN/AlGaN light emitting diode, laser diode, and electronic element can be formed on a GaN template substrate fabricated in steps 1) to 4) described above. For example, when a GaN template substrate is fabricated by using HVPE method, an element structure can be formed on the substrate by the MOCVD crystal growth method that is presently most widely used. After that, individual light emitting elements or electronic elements are obtained by separating the element structure into chips.

Figure 12:
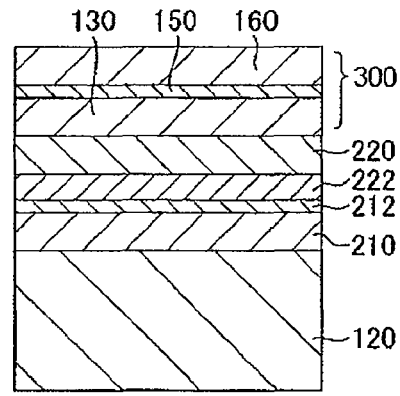
FIG. 12(a) is a sectional view showing the structure of a GaN-based light emitting element.
FIG. 12(b) is a sectional view showing the structure of a GaN-based light emitting element.
FIG. 12(c) is a sectional view showing the structure of a GaN-based light emitting element.
Figure 12:
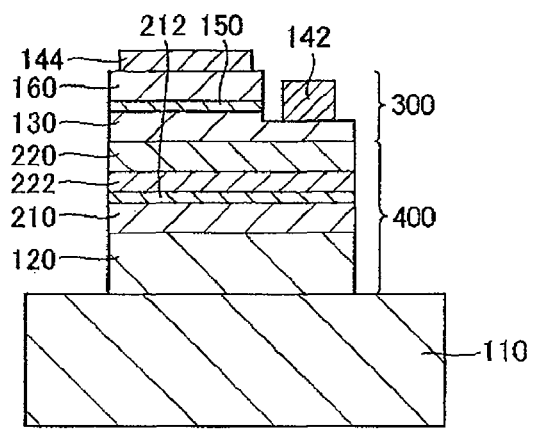
Figure 12:
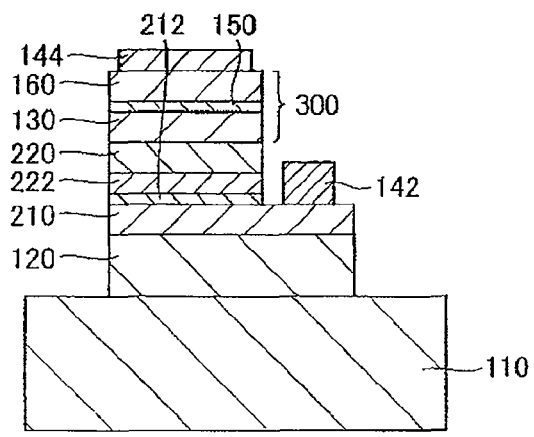

FIG. 12(a) shows an example of the fabrication of a representative light emitting element structure. This is an example in which a GaN-based light emitting element structure or electronic element structure is formed on a GaN single-crystal layer 220 by MOCVD method or MBE method. It is also possible to fabricate other various light emitting element structures and electronic element structures.

FIG. 12(b) shows the formation of an electrode when a GaN buffer layer 222 and GaN single-crystal layer 220 are undoped. An n-type electrode 142 is formed by partially etching an n-GaN layer 130 by dry etching.

FIG. 12(c) shows the case that dry etching is advanced to a GaN buffer layer 222 and GaN single-crystal layer 220, and a metal buffer layer 210 is used as an n-type electrode 142. When an electrode is formed as shown in FIG. 12(b), it is possible to expand the effective area of the element, and increase the chip yield. Also, the element electrical characteristics can be improved when a metal buffer layer having high electrical conductivity is used as an electrode.

<Fabrication of Top-Down Electrode Type Light Emitting Element>

A top-down electrode type light emitting element can be fabricated by removing the metal buffer layer 210 or metal nitride layer 212 in the interface between the sapphire substrate and GaN by selective chemical etching from the light emitting element structure or electronic element structure fabricated by the above steps, thereby separating the sapphire substrate 120 and the chip of the light emitting element or electronic element. The process of fabricating this element will be explained below with reference to FIG. 13.

1) First, as shown in FIG. 13a, a light emitting element or electronic element structure is fabricated by using MOCVD method or MBE method on a GaN template substrate including a GaN single-crystal layer 220 formed by HVPE method or MOCVD method. It is also possible to form a template substrate by forming a single-crystal layer of $In_xGa_{1-x}N$, $Al_xGa_{1-x}N$, or $Al_xIn_yGa_{1-x}N$, instead of the GaN single-crystal layer 220. A light emitting element structure or electronic element structure is fabricated on this template substrate by using MOCVD method or MBE method. FIG. 13a shows the case that a light emitting element is formed, so the fabrication of this light emitting element will be explained below with reference to FIG. 13.

2) Another conductive support substrate (e.g., an Si substrate) 230 is connected on the uppermost layer of the GaN-based light emitting element structure or electronic element structure by using a junction layer 232 having high conductivity (FIG. 13b). This facilitates handling when performing selective chemical etching of the metal buffer layer to be explained later.

Figure 13C:
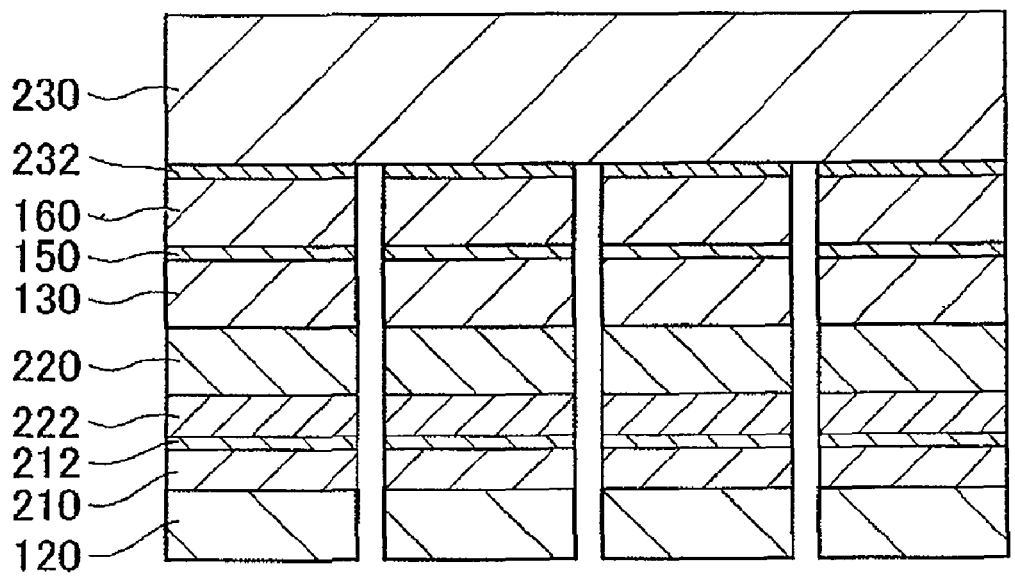
FIG. 13c-(1) is a sectional view showing chip separation in a primary scribing step, and FIG. 13c-(2) is a plan view of a sapphire substrate.
Figure 13C:
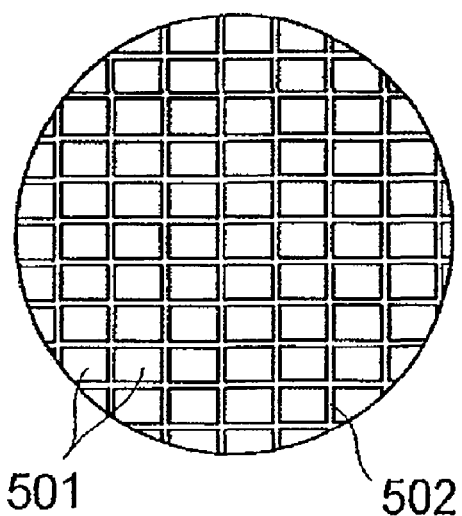

3) After the sapphire substrate 120 is polished, a primary scribing step is performed in which the structure is separated from the sapphire substrate 120 to the brink of the conductive substrate (FIG. 13c). In this step, individual chips can be separated. FIG. 13c(1) is a schematic sectional view, and FIG. 13c(2) is a plan view viewed from the surface of the sapphire substrate 120.

Figure 13D:
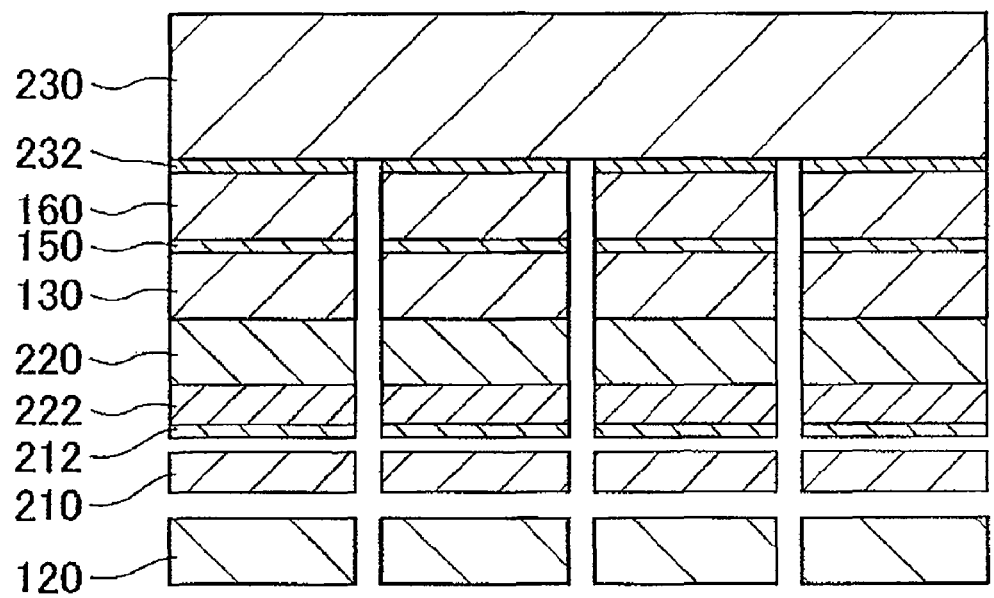
FIG. 13d is a sectional view showing separation of a sapphire substrate by selective chemical etching of a metal buffer layer.

4) The sapphire substrate 120 is separated by selective chemical etching of the metal buffer layer 210 (FIG. 13d). In this step, the sapphire substrate 120 can be separated by supplying an etching solution through spaces between the chips. With this process it is possible to suppress the formation of cracks.

Figure 13E:
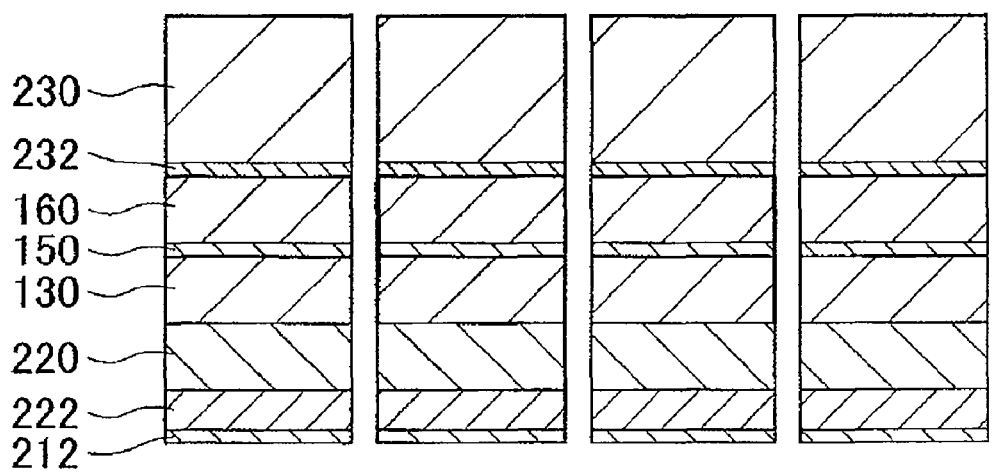
FIG. 13e is a sectional view showing chip separation in a secondary scribing step.

5) In the next step, a secondary scribing step is performed in which the conductive substrate 230 is separated into individual chips (FIG. 13e).

6) To form electrodes in the upper and lower portions of the chip of the light emitting element, the GaN buffer layer 222 and GaN single-crystal layer 220 are formed into p-type or n-type GaN layers.

Figure 13F:
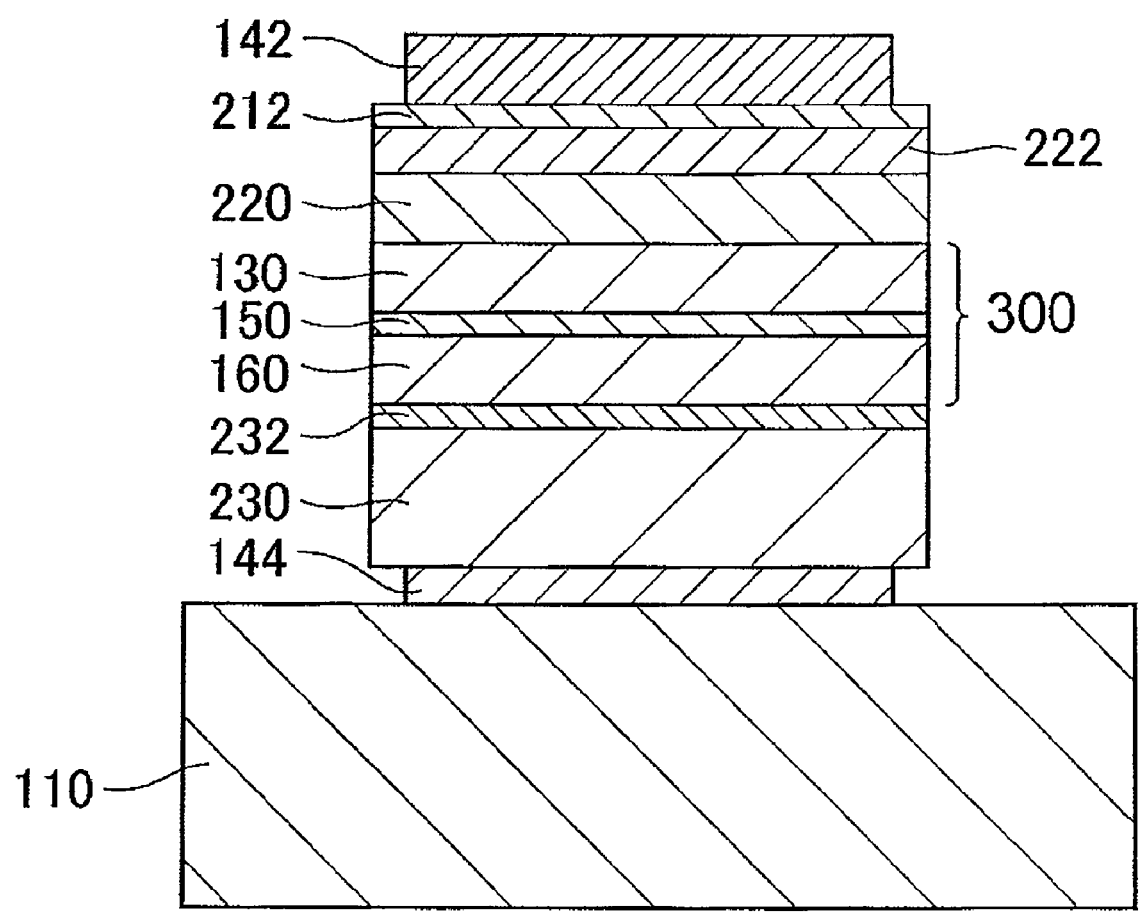
FIG. 13f is a schematic view showing a structure in which a top-down electrode type, high-output light emitting element is mounted on a submount layer after electrodes are formed in the upper and lower portions.

FIG. 13f is a schematic view showing a structure in which electrodes 142 and 144 are formed in the upper and lower portions, and the top-down electrode type light emitting element is mounted on a submount layer 110.

The primary scribing step described above is a preparation step for chip separation, and the sapphire substrate is separated by the subsequent chemical etching. The secondary scribing is a chip separation step that separates the conductive support substrate. Note that the primary scribing has the effect of reducing the stress generated when the metal buffer layer is etched, thereby suppressing the formation of cracks during the etching.

The object of the second scribing step is to completely separate the chips in the second scribing step for the adhered conductive substrate.

<Another Element Fabrication Method>

Figure 14:
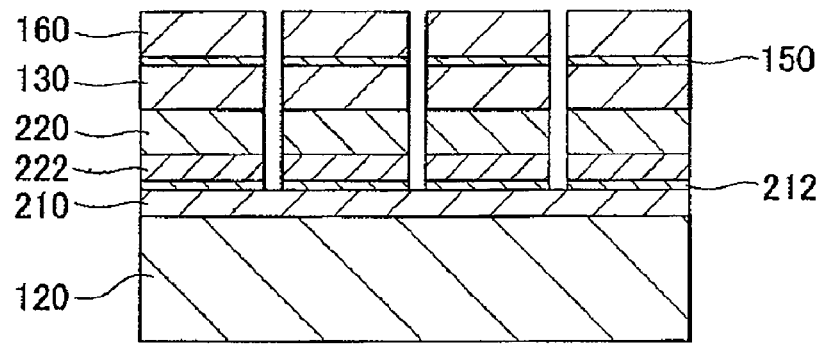
FIG. 14 shows views for explaining another method of fabricating a top-down electrode type light emitting element or electronic element, that is.
Figure 14:
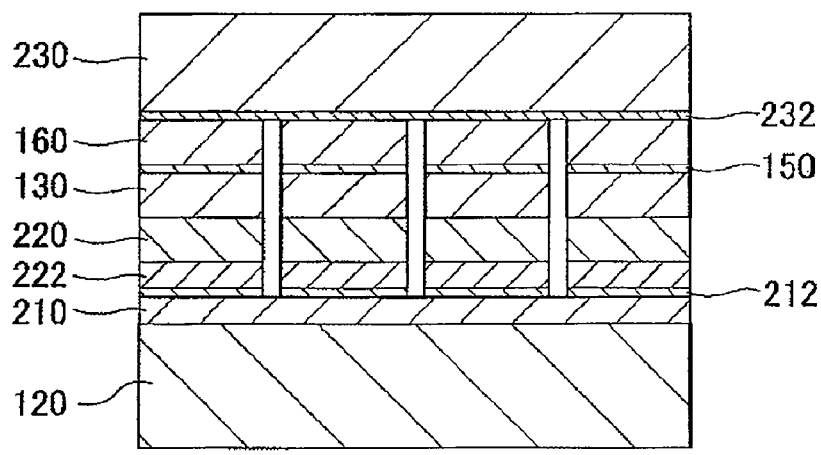
Figure 14:
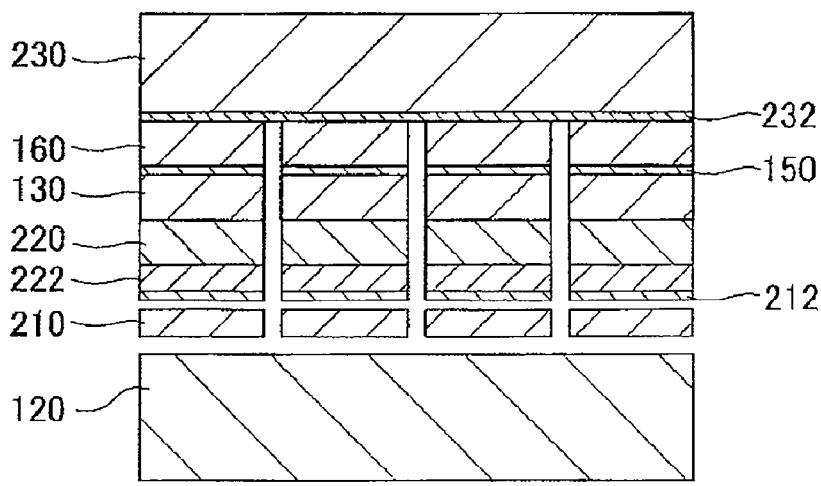

Another method of fabricating the top-down electrode type light emitting element or electronic element will be explained below with reference to FIG. 14. As an example, FIG. 14 illustrates a light emitting element.

1) As shown in FIG. 14(a), primary scribing step or dry etching step is performed in which a light emitting element structure fabricated on a GaN template substrate formed by HVPE method or MOCVD method is separated in the brink of a metal nitride layer 212 or metal buffer layer 210 into chips (FIG. 14(a) shows the case where the structure is separated to the metal nitride layer 212).

2) Then, to facilitate handling, a conductive support substrate (e.g., an Si substrate) 230 is adhered on the uppermost layer of the GaN-based light emitting element structure or electronic element structure by using a junction layer 232 having high conductivity (FIG. 14(b)). As the junction layer, it is possible to use, for example, Cu, Au, or Ag.

3) The metal buffer layer 210 or metal nitride layer 212 is separated from a sapphire substrate 120 by selective chemical etching (FIG. 14(c)).

4) Fabrication steps after that are performed in the same manner as shown in FIGS. 13(e) and 13(f) described above, thereby fabricating the top-down electrode type light emitting element or electronic element.

<Etching of Metal Buffer Layer and Metal Nitride Layer>

The above-mentioned selective chemical etching uses an etching solution corresponding to the types of the nitrided metal buffer layer and metal nitride layer. Many types of etching solutions can be selected for one metal buffer layer and one metal nitride layer. The present invention is thus characterized by selectively etching the metal buffer layer and metal nitride layer at the same time by means of the same etching solution.

Cr can be etched by either wet etching or dry etching. The embodiment used wet etching because etching was performed from the side surfaces. Known etching solutions are, for example, HCl, $HNO_3$, $HClO_4$, and CAN (Ceric Ammonium Nitrate).

It is well known that an N-polarity GaN surface is etched by a chemical solution more easily than a Ga-polarity GaN surface. An N-polarity GaN surface appears after Cr and CrN of the metal buffer layer are etched, and this N-polarity GaN surface may be a rough surface because it is etched with an etching solution. Therefore, a solution mixture of $Ce(NH_4)_2(NO_3)_6+HClO_4+H_2O$ having little influence on the N-polarity GaN surface is suitable.

Note that when Cu is used as a metal buffer layer, nitric acid ($HNO_3$)+water ($H_2O$) can be used as an etching solution.

When chips can be separated from the substrate by selective chemical etching of the metal buffer layer and metal nitride layer as described above, an electrode can be formed on the surface of the GaN-based element structure (normally, the GaN-based semiconductor surface) of the separated chip.

It is possible to control the etching rate by the temperature and concentration of the solution, and suppress cracks produced upon separation of light emitting element or electronic element from the sapphire substrate by adjusting the etching rate.

<Fabrication of High-Output, High-Luminance Light Emitting Diode>

Figure 15:
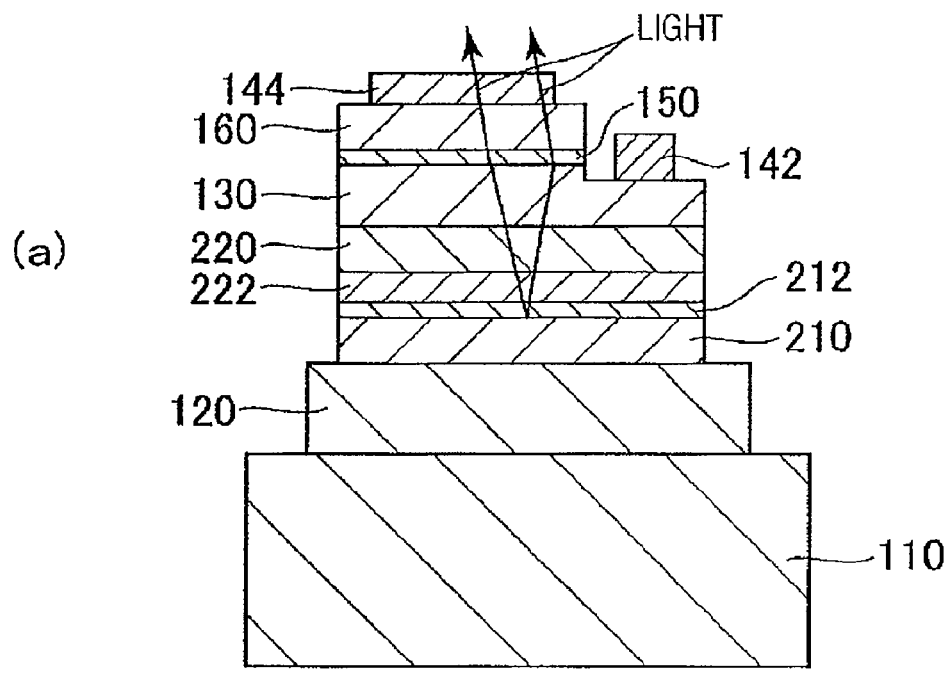
FIG. 15 shows views for explaining the way the light emission efficiency is increased by using reflection of a metal buffer layer, that is.
Figure 15:
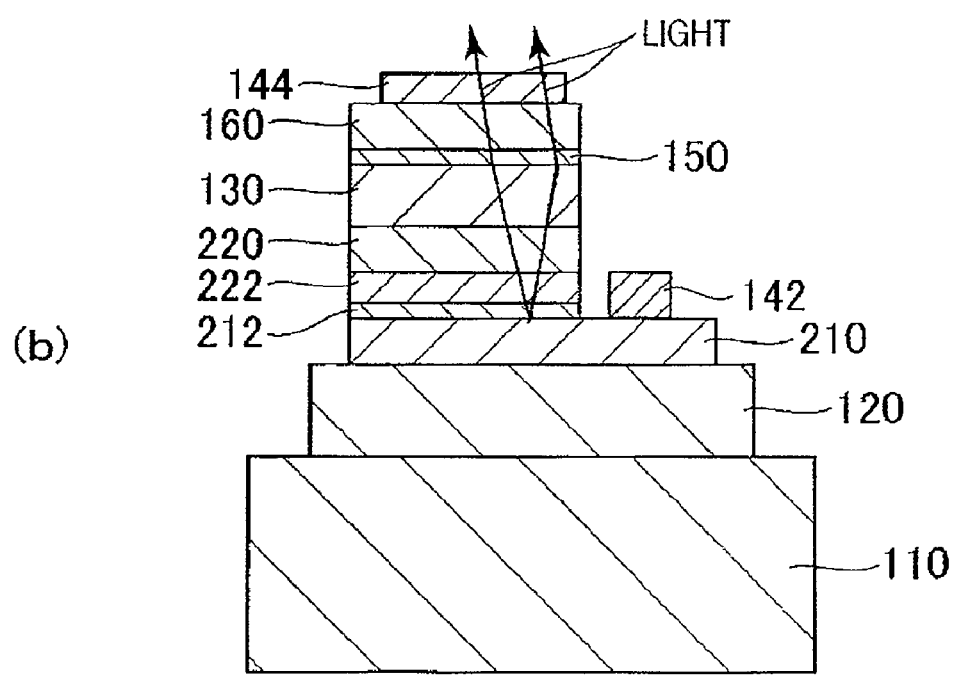

When forming an element after an electrode is formed on the fabricated light emitting element chip, the metal buffer layer 210 existing in the interface between the sapphire substrate and light emitting element reflects light emitted from the active layer 150 by injection of an electric current. In a surface emission type light emitting element, this reflected light from the metal buffer layer 210 increases the light emission efficiency. FIGS. 15(a) and 15(b) are schematic views showing this.

FIG. 15(a) shows electrode formation when the GaN buffer layer 222 and GaN single-crystal layer 220 are undoped. In this arrangement, an n-type electrode 142 is formed by partially etching the n-GaN layer by dry etching. FIG. 15(b) shows the case where dry etching is advanced to the GaN buffer layer 222 and GaN single-crystal layer 220, and the metal buffer layer 210 is used as an n-type electrode 142.

To increase the efficiency of the light emitting element by the reflection of the metal buffer layer 210, the thickness of the metal buffer layer was determined based on simulation. FIG. 16 shows examples of the calculations of reflection, including absorption to a wavelength of 460 nm, performed by changing the thicknesses of the metal buffer layers of Cr and Cu. A maximum reflectance was about 40% when the thickness of Cr was about 200 Å (about 20 nm), and about 35% when the thickness of Cu was about 400 Å (about 40 nm). The light emission efficiency of the light emitting element can be increased by this reflection in the interface.

Figure 17:
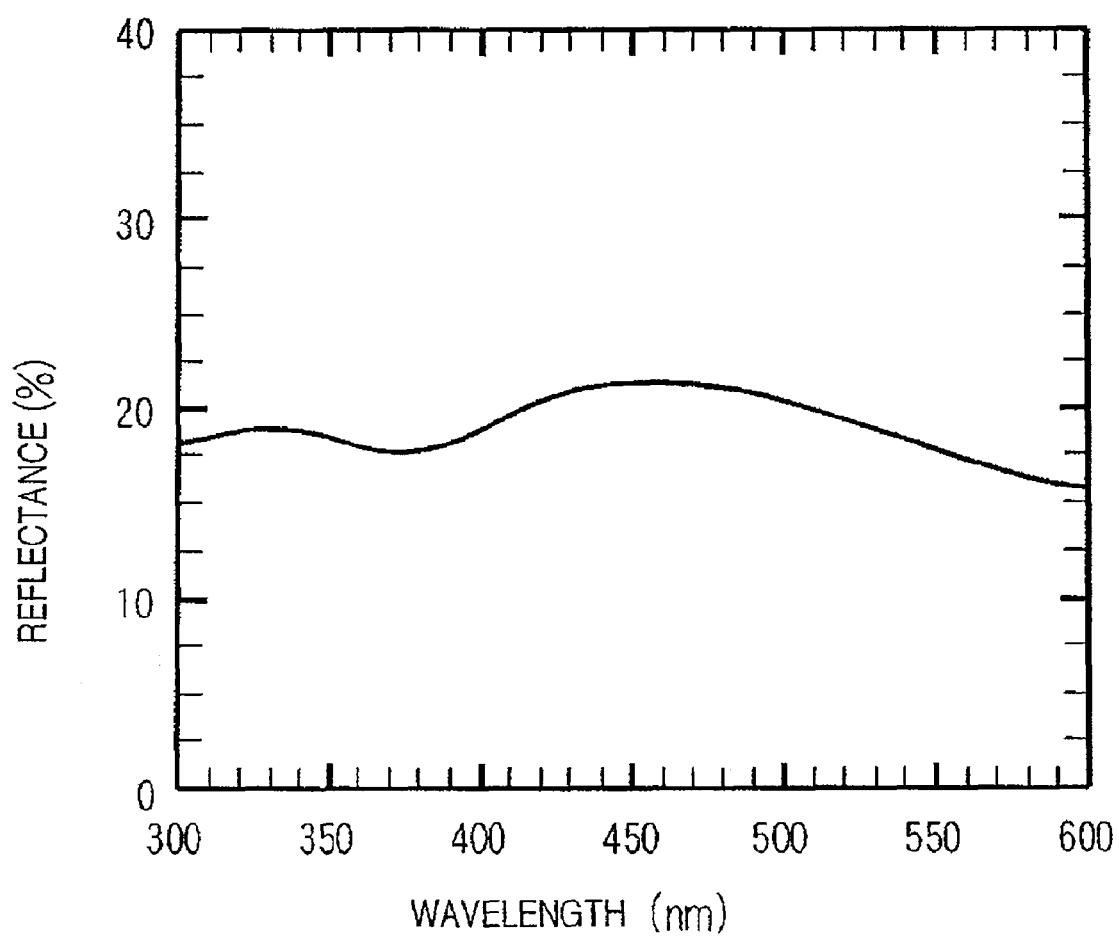
FIG. 17 is a graph showing the result (calculated value) of calculation of the reflectivity (reflectance) with respect to the light emission wavelength when the thickness of a Cr metal buffer layer is 100 Å (10 nm)

A metal buffer layer and its thickness optimum for the light emission wavelength of a light emitting diode were determined by using simulation of the reflectance with respect to the thickness of the metal buffer layer. FIG. 17 shows the result of the calculation of the reflectance to the wavelength of incident light when the thickness of the Cr metal buffer layer was 100 Å (10 nm) and the wavelength was 460 nm. The result shown in FIG. 17 indicates that a constant reflectance was maintained regardless of the wavelength, so the present invention is also applicable to an ultraviolet light emitting diode.

FIG. 18 shows the measurement values of a sample fabricated by setting the thickness of the Cr metal buffer layer to 100 Å (10 nm). FIGS. 17 and 18 reveal that the calculated values and measurement values match at a ratio of 19% to 20%. That is, to obtain a high-luminance light emitting diode using the reflectance of the metal buffer layer, an optimum thickness must be set by taking account of absorption, reflection, and transmission at the light emission wavelength. The optimum thickness of Cr or Cu can be determined based on simulation.

<Fabrication of GaN Freestanding Substrate>

A GaN freestanding substrate can be fabricated by selective chemical etching of the metal buffer layer or/and the metal nitride layer.

As described above, a high-temperature GaN single-crystal layer was grown on a metal buffer layer on a sapphire substrate, and the thickness of the grown high-temperature GaN single-crystal layer was finally set at 100 μm or more. A GaN freestanding substrate can be fabricated after the growth by separating thick GaN film from the sapphire substrate by selective chemical etching of the metal buffer layer or a metal nitride layer.

Figure 19:
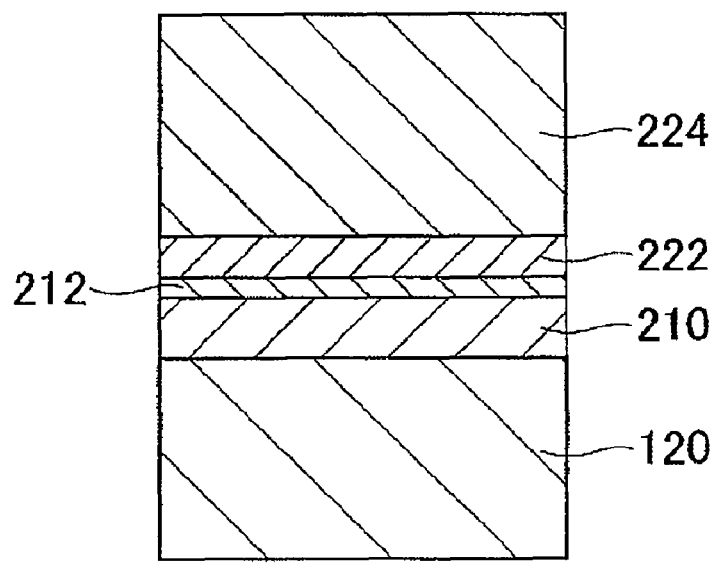
Figure 19:
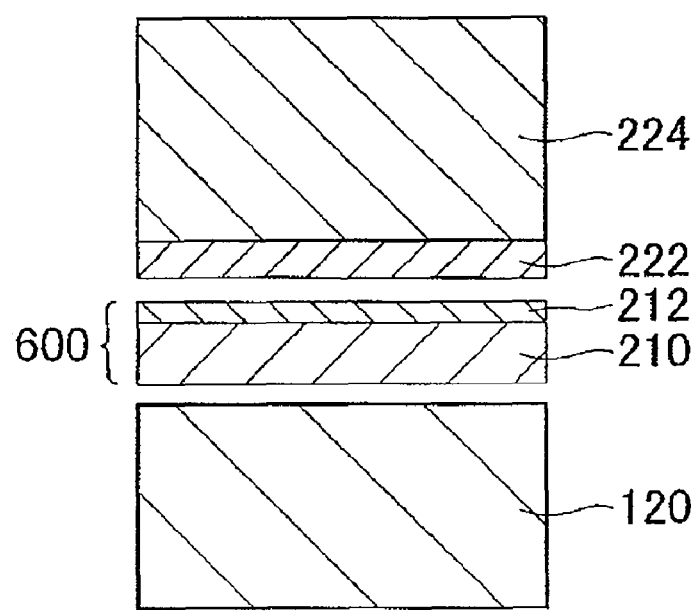

FIG. 19(a) is a schematic sectional view showing a structure in which a thick GaN film 224 is grown on a metal buffer layer 210 by HVPE method, and FIG. 19(b) is a schematic view showing a GaN freestanding substrate fabricated by selective chemical etching of the metal buffer layer 210.

Figure 20:
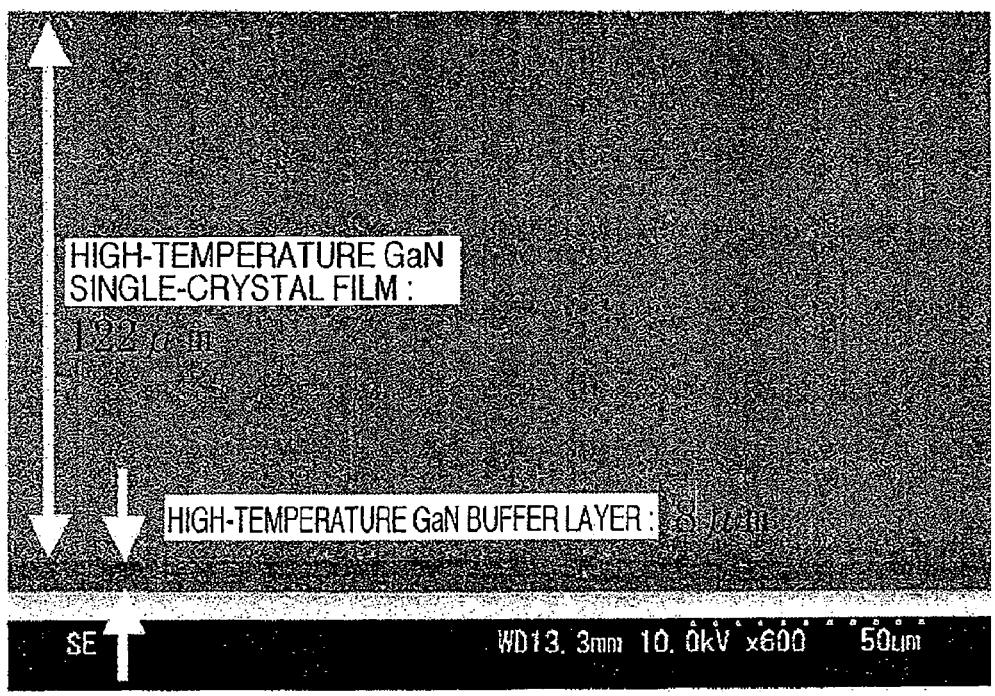
FIG. 20 is a sectional SEM photograph of a GaN freestanding substrate obtained by selective chemical etching of a Cr metal buffer layer.

FIG. 20 shows an SEM sectional photograph of a GaN freestanding substrate obtained by growing a 122-μm thick high-temperature GaN single-crystal layer to be used as a GaN freestanding substrate, and then performing selective chemical etching of the metal buffer layer. The etching was performed under the same etching conditions as described above. In this etching, the metal buffer layer and a metal nitride layer can be simultaneously selectively etched with almost the same etching solution.

When the GaN freestanding substrate can be separated from the sapphire substrate by selective chemical etching of the metal buffer layer and metal nitride layer as described above, the separated surface of the GaN freestanding substrate is also flat. This obviates the need for an additional polishing step of removing or planarizing the metal nitride layer remaining on the separated side, unlike in patent references 1 and 2.

<Fabrication of GaN Template Substrate on Metal Substrate>

A GaN layer can be grown after directly nitriding the surface of a Cu substrate capable of providing a metal single-crystal substrate as a presently commercially available substrate, and forming a GaN buffer layer on the Cu metal nitride layer, or after nitriding the surface of the Cu substrate by the above-mentioned method, and forming a GaN buffer layer on the Cu metal nitride layer.

When a Cu substrate having good conduction properties and a high thermal conductivity is used, a GaN-based light emitting diode can be formed on the grown GaN layer without using any submount in the light emitting diode packaging step.

It is also possible to increase the chip yield and simplify the steps because the top-down electrode is used as an electrode.

Figure 21:
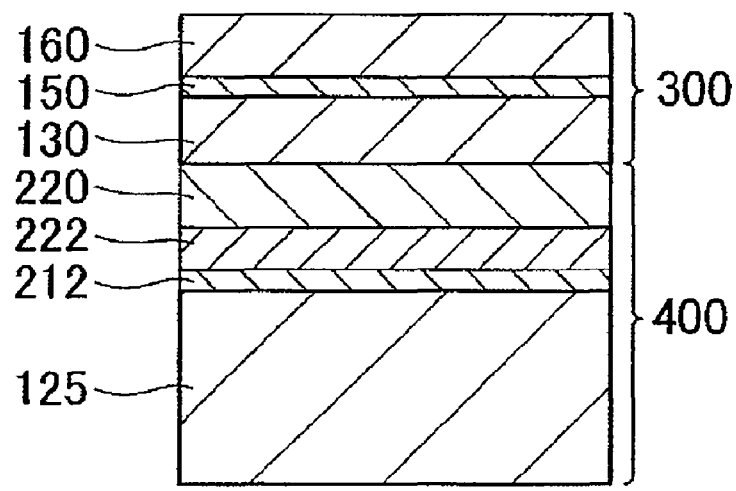
Figure 21:
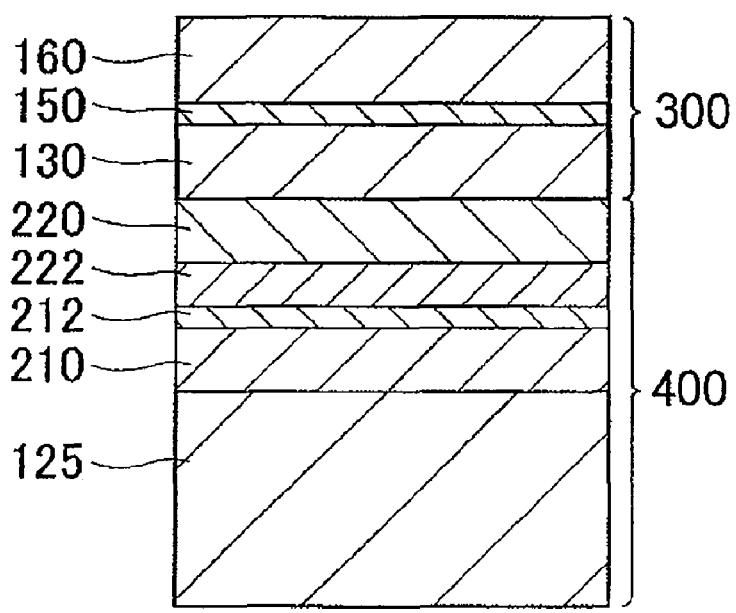

Metal substrates having various metal layers can also be used instead of the Cu substrate, and the surface of this metal layer can also be nitrided. FIG. 21 illustrate fabricated structures.

FIG. 21(a) shows the case where a GaN layer 220 was grown on a Cu substrate 125 through nitridation process, and light emitting diode structures 130, 150, and 160 were directly grown on the GaN layer 220.

FIG. 21(b) shows a structure obtained by forming a Cu layer 210 on a Cu substrate 125 by vacuum vapor deposition method, sputtering method, or chemical vapor deposition method, performing nitridation process similar to that shown in FIG. 21(a), growing a GaN buffer layer 222 and high-temperature GaN single-crystal layer 220, and finally fabricating a light emitting element on top of the structure.

The methods of fabricating high-quality GaN freestanding substrate with high reproducibility have been described above.

Patent reference 2 discloses that Ti is used as a metal buffer layer, and GaN is grown on nitrided Ti and removed by using the decrease in mechanical strength caused by air spaces formed by desorption of hydrogen contained in the region. The disclosed metal nitride layer is a multi-domain layer and has low crystal orientation, and the crystallinity of the GaN layer on this metal nitride layer is also insufficient, presumably because the method as described above is used. The method of the present invention keeps flatness with which no air spaces form in the metal buffer layer region, and can also improve the orientation of the metal nitride layer, so the GaN layer on this metal nitride layer well improves immediately after the start of growth. In addition, this metal buffer layer region can be chemically etched and hence readily removed from the underlying substrate such as sapphire, so a high-quality GaN freestanding substrate can be obtained. Also, unlike in the description of patent reference 2, the flatness of the removed GaN and the removal surface of the underlying substrate is maintained, and this achieves the additional effect that at least the underlying substrate can be used any number of times. Note that in the method described in patent reference 2, the reaction probably occurs between the underlying substrate and metal buffer layer as well, so the removed underlying substrate must be polished before being reused because the surface is roughened. Also, this reaction presumably makes removal by chemical etching difficult in the method described in patent reference 2.

Conventionally, GaN or AlN was mainly used as a low-temperature buffer layer in order to implement a GaN-based light emitting element on a sapphire substrate. The present invention has successfully grown a high-quality GaN single crystal by using a metal buffer layer, metal nitride layer, and GaN buffer layer as new buffer layers.

Furthermore, a new amorphous metal can be used as a GaN buffer layer by the technique proposed by the present invention. This makes various element applications feasible, and makes growth on a metal, semiconductor, and dielectric material in an amorphous state possible. Although GaN crystal growth is presently limited on a sapphire substrate and SiC substrate, the present invention is an important technique capable of increasing the number of types of substrates usable in GaN crystal growth.

The technique provided by the present invention provides an important technique for next-generation GaN-based element applications. From the viewpoint of an element application, a high-efficiency light emitting diode can be fabricated by using a metal buffer layer. It is also possible to, for example, reduce the number of fabrication steps of a top-down electrode type light emitting element obtained by the conventional laser lift-off method, provide various types of metal buffer layers, and provide various substrates. Practical economical and technical effects are as follows.

1) Selective chemical etching of a metal buffer layer proposed by the present invention can simply separate a fabricated GaN-based element from a substrate. This separation achieves the effects of simplifying the fabrication steps of the top-down electrode type, high-luminance light emitting element, increasing the productivity of the element, and reducing the cost of the element.

2) The use of a sapphire substrate makes it possible to fabricate a high-output, high-luminance light emitting diode using the reflectance of a metal buffer layer, and simply control the complexity and reproducibility of the fabrication steps when compared to the case that the conventional patterned sapphire substrate or the flip-chip is used.

3) The conventional GaN-based light emitting diode and laser diode mainly use a sapphire substrate or SiC substrate. However, the present invention makes it possible to use an Si substrate, GaAs substrate, metal single-crystal substrate, and amorphous substrate, and use various metal buffer layers.

4) A GaN freestanding substrate can be fabricated by growing a thick GaN film on a sapphire substrate including a metal buffer layer, and separating the thick GaN film from the substrate by selective chemical etching of the metal buffer layer or a metal nitride layer.

The invention claimed is:

1. A GaN single crystal growth method comprising:
   a chromium layer growth process of growing a chromium layer on an underlying substrate;
   a nitridation process of forming a chromium nitride layer by nitriding at least a surface of the chromium layer;
   a GaN buffer layer growth process of growing a GaN buffer layer on the chromium nitride layer; and
   a GaN layer growth process of growing a high temperature single-crystal GaN layer on the GaN buffer layer,
   wherein the chromium nitride layer has (111) orientation, and
   wherein, in the GaN buffer layer growth process, the GaN buffer layer is grown at a temperature of 800° C. to 1,000° C., and, in the GaN layer growth process, the high-temperature single-crystal GaN layer is grown at not less than 1,000° C. and higher than the growth temperature of the GaN buffer layer.

2. A GaN single crystal growth method comprising:
   a nitridation process of forming a chromium nitride layer by nitriding a surface of a chromium underlying substrate;
   a GaN buffer layer growth process of growing a GaN buffer layer on the chromium nitride layer; and
   a GaN layer growth process of growing a high-temperature single-crystal GaN layer on the GaN buffer layer,
   wherein the chromium nitride layer has (111) orientation, and
   wherein, in the GaN buffer layer growth process, the GaN buffer layer is grown at a temperature of 800° C. to 1,000° C., and, in the GaN layer growth process, the high-temperature single-crystal GaN layer is grown at not less than 1,000° C. and higher than the growth temperature of the GaN buffer layer.

3. A GaN single crystal growth method according to claim 1, wherein
   nitridation is performed by a gas containing ammonia in the nitridation process.

4. A GaN single crystal growth method according to claim 1, wherein
   nitridation is performed at a temperature of 500° C. to 1,000° C. in the nitridation process.

5. A GaN single crystal growth method according to claim 1, wherein
   the GaN buffer layer is grown to have a thickness of 50 nm to 30 μM in the GaN buffer layer growth process.

6. A GaN single crystal growth method according to claim 1, wherein
   the underlying substrate has a metal layer on a surface.

7. A GaN single crystal growth method according to claim 1, the method further comprising
   a separation process of separating the single-crystal GaN layer from the underlying substrate by selective chemical etching.

8. A GaN single crystal growth method according to claim 2, wherein
   nitridation is performed by a gas containing ammonia in the nitridation process.

9. A GaN single crystal growth method according to claim 2, wherein
   nitridation is performed at a temperature of 500° C. to 1,000° C. in the nitridation process.

10. A GaN single crystal growth method according to claim 2, wherein
    the GaN buffer layer is grown to have a thickness of 50 nm to 30 μm in the GaN buffer layer growth process.

11. A GaN single crystal growth method according to claim 2, wherein
    the underlying substrate has a metal layer on a surface.

12. A GaN single crystal growth method according to claim 2, the method further comprising
    a separation process of separating the single-crystal GaN layer from the underlying substrate by selective chemical etching.

* * * * *